(12) United States Patent
Noh

(10) Patent No.: US 10,332,788 B2
(45) Date of Patent: Jun. 25, 2019

(54) METHOD OF MANUFACTURING A SEMICONDUCTOR DEVICE USING REFERENCE PATTERN

(71) Applicant: SK hynix Inc., Icheon-si Gyeonggi-do (KR)

(72) Inventor: Yoo Hyun Noh, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/719,170

(22) Filed: Sep. 28, 2017

(65) Prior Publication Data

US 2018/0301372 A1 Oct. 18, 2018

(30) Foreign Application Priority Data

Apr. 13, 2017 (KR) .................. 10-2017-0048019

(51) Int. Cl.
*H01L 21/66* (2006.01)
*H01L 21/768* (2006.01)
(Continued)

(52) U.S. Cl.
CPC .. *H01L 21/76816* (2013.01); *H01L 21/76877* (2013.01); *H01L 22/12* (2013.01); *H01L 23/5226* (2013.01); *H01L 23/5283* (2013.01); *H01L 23/544* (2013.01); *H01L 27/11531* (2013.01); *H01L 27/11548* (2013.01);
(Continued)

(58) Field of Classification Search
CPC ......... H01L 21/76816; H01L 27/11573; H01L 22/12; H01L 23/5283; H01L 23/5226; H01L 23/544; H01L 21/76877; H01L 27/11578; H01L 27/11575;
(Continued)

(56) References Cited

U.S. PATENT DOCUMENTS

2012/0238093 A1* 9/2012 Park ............... H01L 21/76838 438/675
2013/0161821 A1* 6/2013 Hwang ............ H01L 23/5283 257/773

(Continued)

FOREIGN PATENT DOCUMENTS

KR 1020120077031 A 7/2012
KR 1020150106523 A 9/2015

*Primary Examiner* — Anthony Ho
*Assistant Examiner* — Mohammad M Hoque
(74) *Attorney, Agent, or Firm* — William Park & Associates Ltd.

(57) ABSTRACT

Provided herein may be a method of manufacturing a semiconductor device. The method may include: forming a first stack in which a first pad region, a second pad region and first dummy region are successively defined; forming a second stack on the first stack; forming a first pad structure and a first reference pattern by patterning the second stack, the first pad structure being disposed on the first pad region and having a stepped shape, the first reference pattern being disposed on the first dummy region of the first stack; forming a first pad mask pattern on the first stack, the first pad mask pattern being aligned by measuring the distance from the first reference pattern thereto and covering the first and second pad regions; and forming a second pad structure having a stepped shape by patterning the second pad region while shrinking the first pad mask pattern.

20 Claims, 20 Drawing Sheets

(51) Int. Cl.
*H01L 27/11548* (2017.01)
*H01L 27/11551* (2017.01)
*H01L 27/11531* (2017.01)
*H01L 27/11575* (2017.01)
*H01L 27/11578* (2017.01)
*H01L 23/544* (2006.01)
*H01L 23/522* (2006.01)
*H01L 23/528* (2006.01)
*H01L 27/11573* (2017.01)

(52) U.S. Cl.
CPC .. *H01L 27/11551* (2013.01); *H01L 27/11573* (2013.01); *H01L 27/11575* (2013.01); *H01L 27/11578* (2013.01); *H01L 2223/54426* (2013.01)

(58) Field of Classification Search
CPC ......... H01L 27/11531; H01L 27/11551; H01L 27/11548; H01L 2223/54426
USPC .......................................................... 438/14
See application file for complete search history.

(56) References Cited

U.S. PATENT DOCUMENTS

2014/0162420 A1* 6/2014 Oh .................... H01L 27/11565
438/270
2015/0236038 A1* 8/2015 Pachamuthu ..... H01L 27/11582
257/326
2016/0322381 A1* 11/2016 Liu .................. H01L 27/11573
2017/0373197 A1* 12/2017 Sharangpani ....... H01L 29/7883

\* cited by examiner

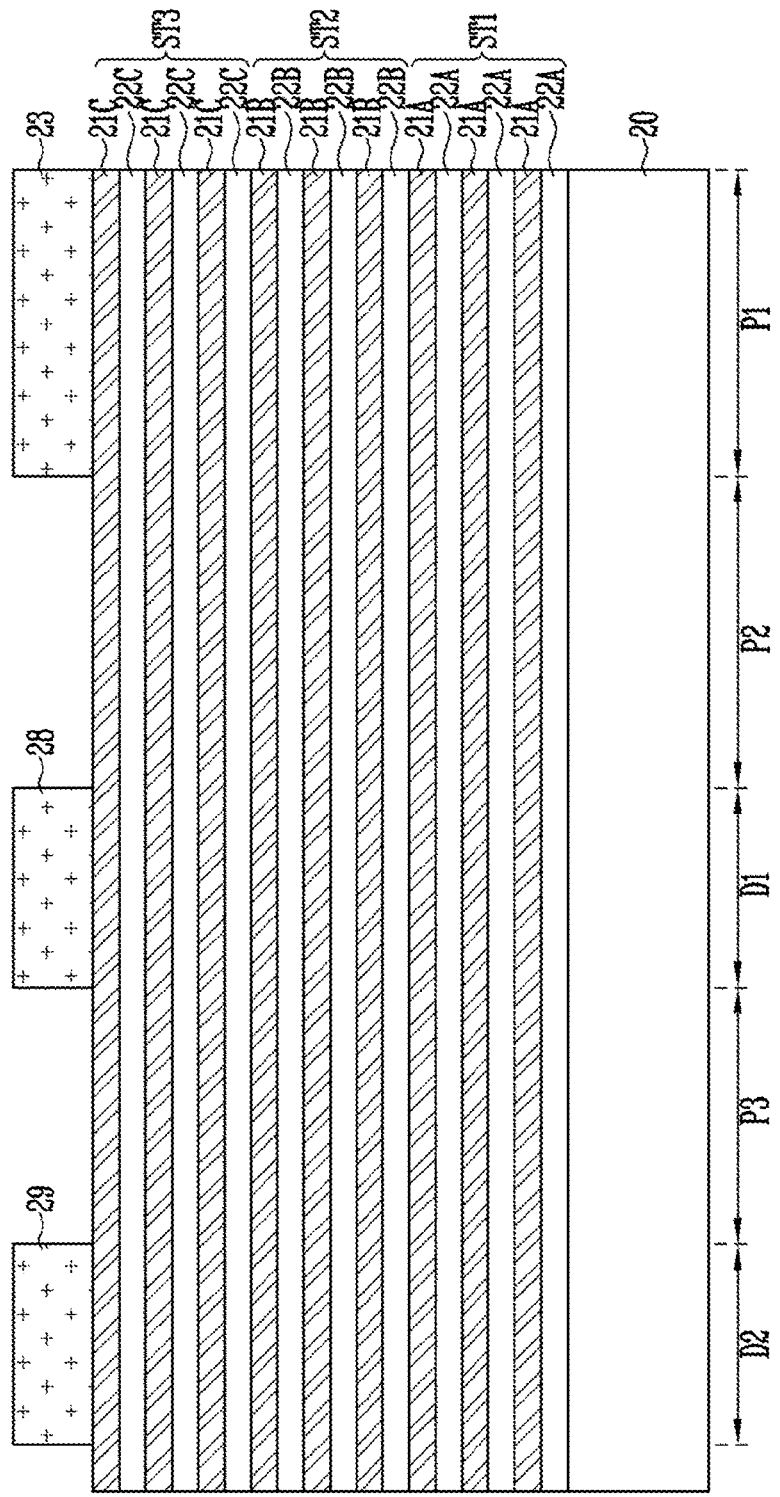

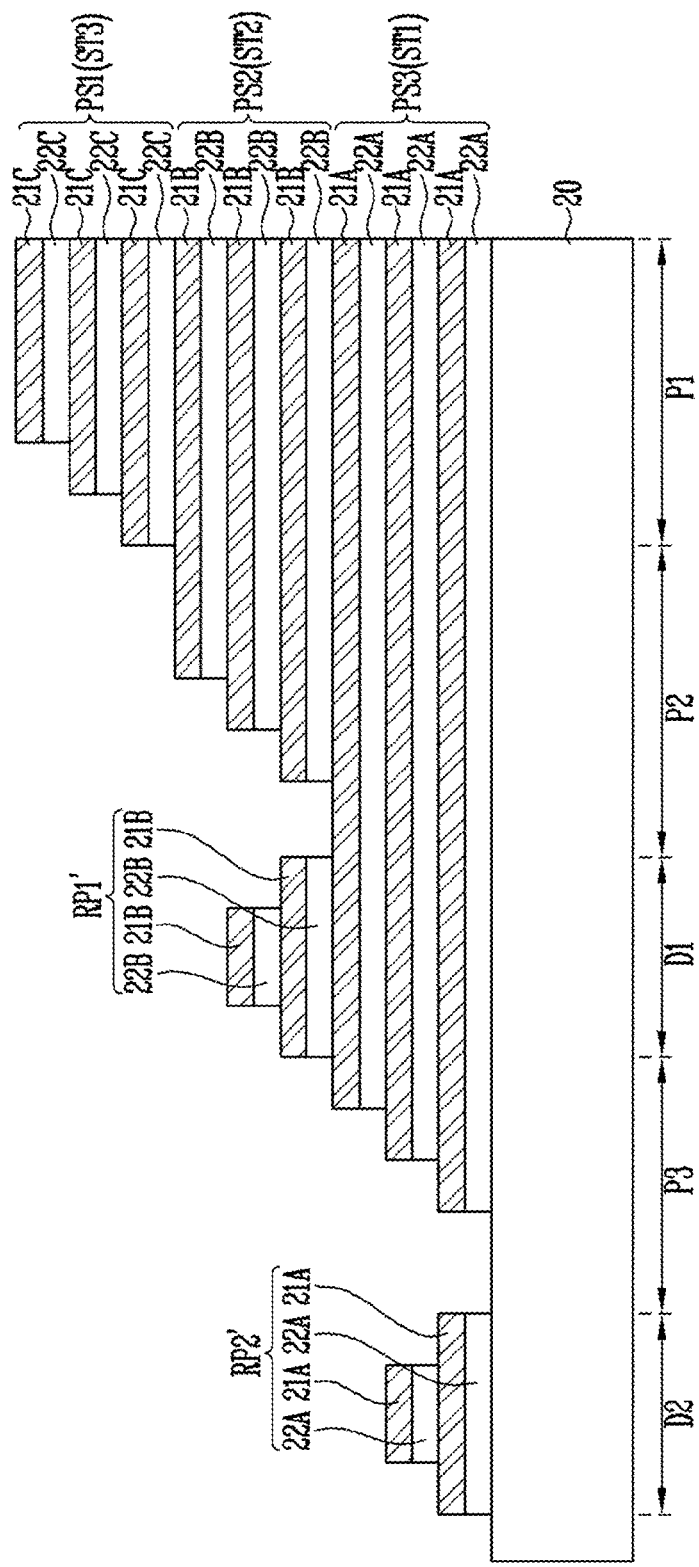

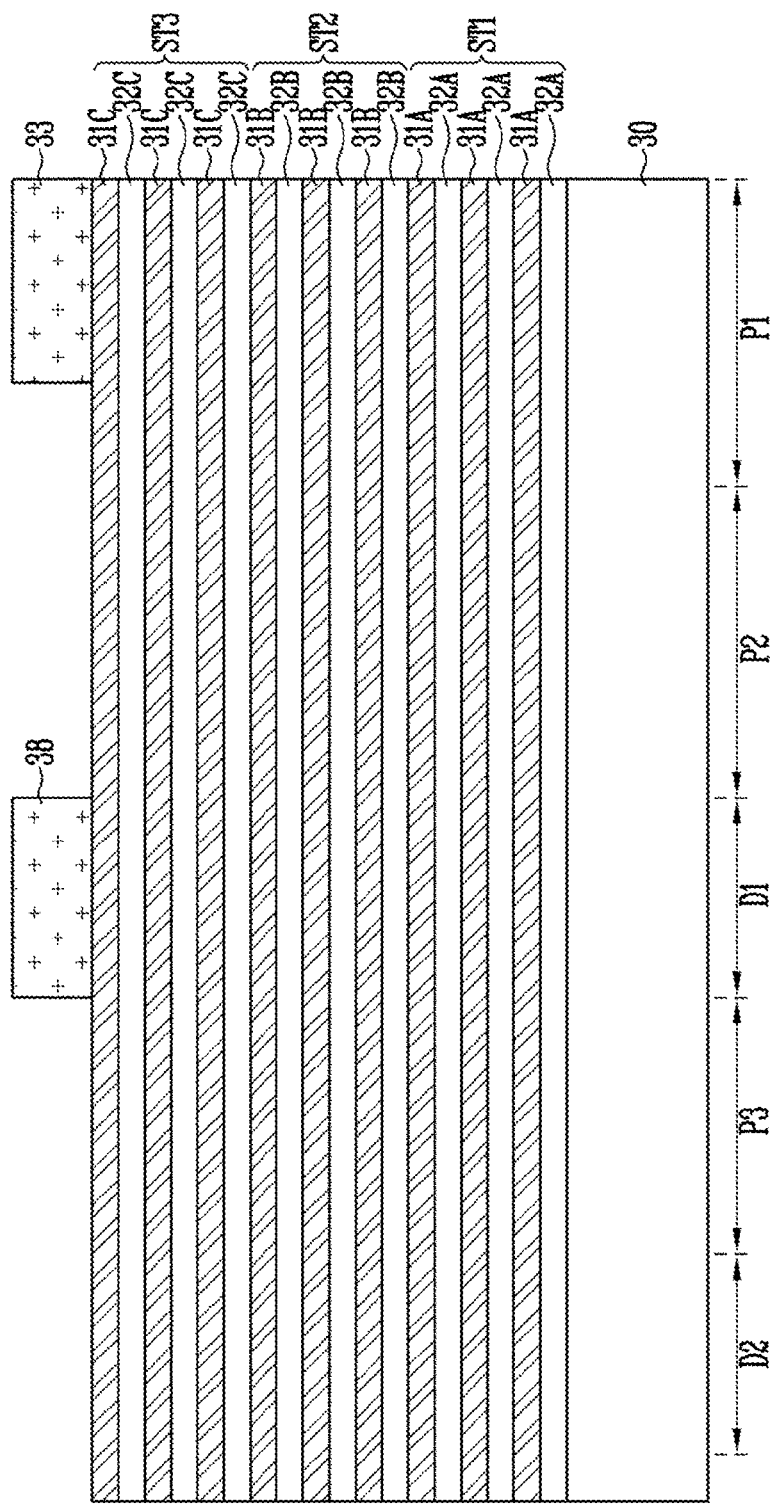

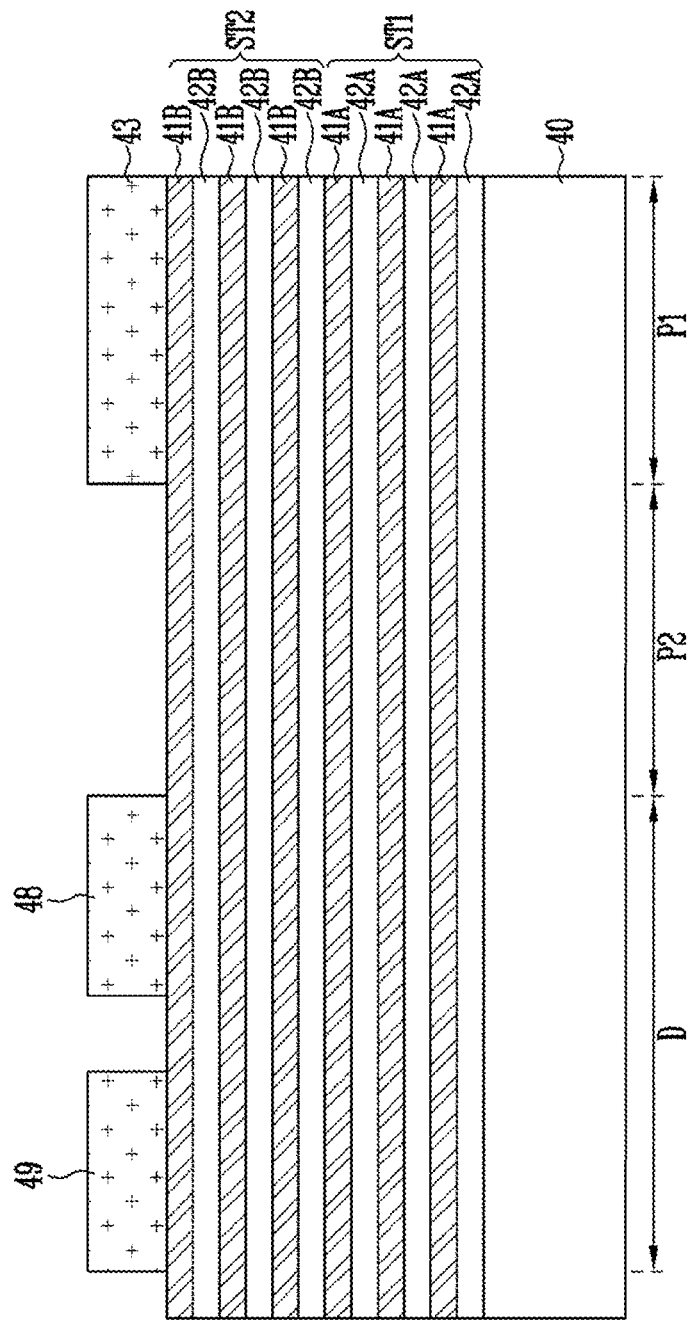

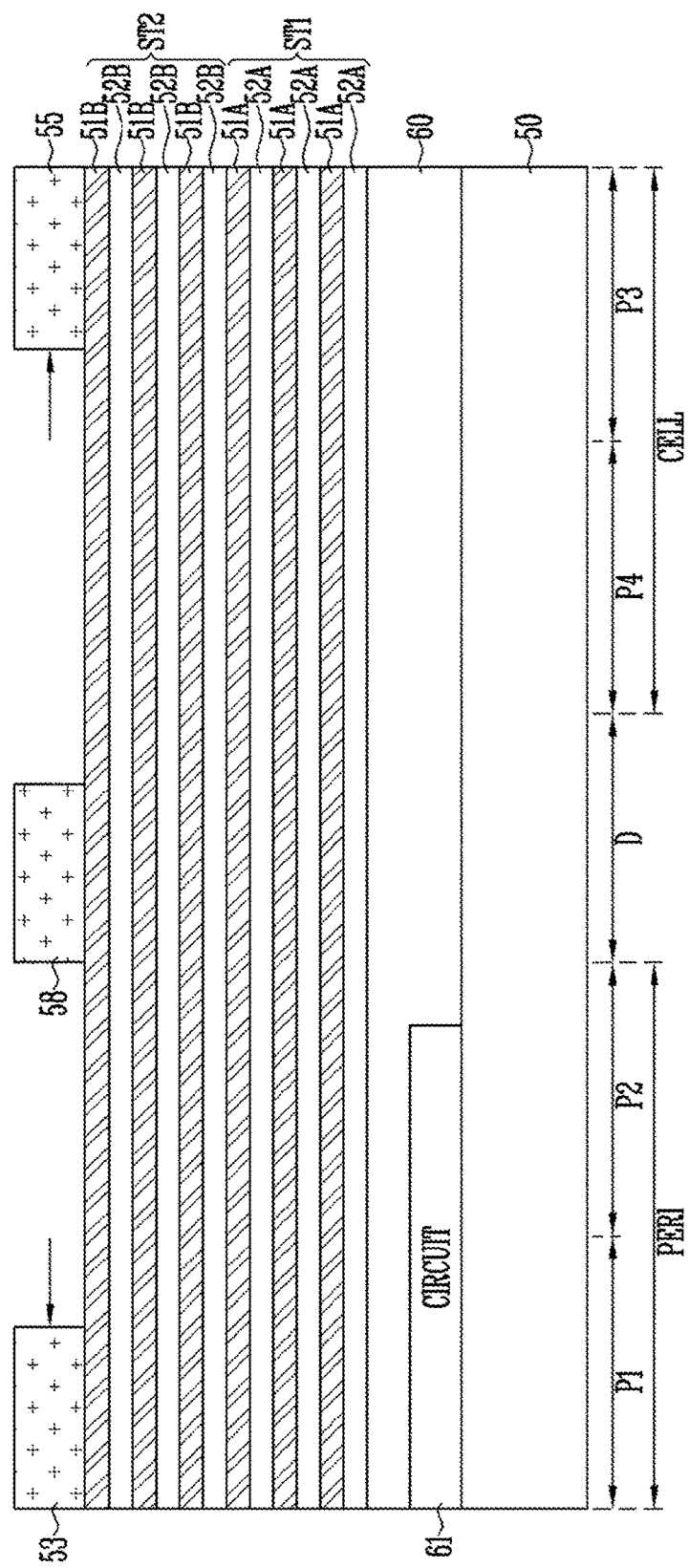

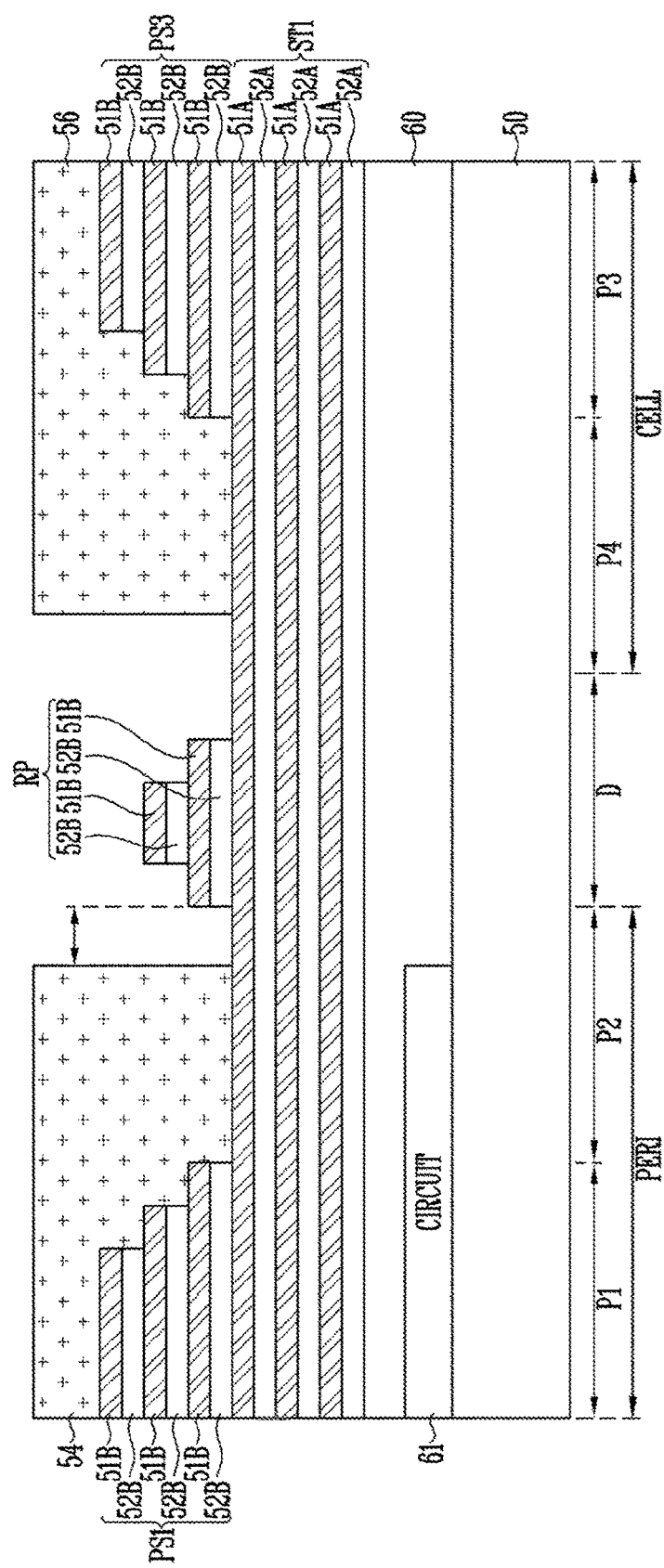

METHOD OF MANUFACTURING A SEMICONDUCTOR DEVICE USING REFERENCE PATTERN

CROSS-REFERENCE TO RELATED APPLICATION

The present application claims priority under 35 U.S.C. § 119(a) to Korean patent application number 10-2017-0048019 filed on Apr. 13, 2017 in the Korean Intellectual Property Office, the entire disclosure of which is incorporated herein by reference.

BACKGROUND

1. Technical Field

Various embodiments of the present disclosure generally relate to an electronic device, and more particularly, to a method of manufacturing a semiconductor device.

2. Related Art

Non-volatile memory devices retain stored data regardless of power on/off conditions. Recently, as a two-dimensional non-volatile memory device including memory cells formed on a substrate in a single layer has reached a limit in enhancing its degree of integration, a three-dimensional (3D) non-volatile memory device including memory cells stacked in a vertical direction on a substrate has been proposed.

A three-dimensional non-volatile memory device may include interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

Various embodiments of the present disclosure are directed to a method of manufacturing a semiconductor device which is configured to facilitate the manufacturing process thereof and has stable structure and improved characteristics.

An embodiment of the present disclosure may provide for a method of manufacturing a semiconductor device, including: forming a first stack in which a first pad region, a second pad region, and a first dummy region are successively defined; forming a second stack on the first stack; forming a first pad structure and a first reference pattern by patterning the second stack, the first pad structure being disposed on the first pad region of the first stack and having a stepped shape, the first reference pattern being disposed on the first dummy region of the first stack; forming a first pad mask pattern on the first stack, the first pad mask pattern being aligned by measuring a distance from the first reference pattern to the first pad mask pattern and covering the first and second pad regions; and forming a second pad structure having a stepped shape by patterning the second pad region of the first stack while shrinking the first pad mask pattern.

BRIEF DESCRIPTION OF THE DRAWINGS

FIGS. 2A to 2D are sectional views illustrating a method of manufacturing a semiconductor device according to an embodiment of the present disclosure.

FIGS. 3A to 3D are sectional views illustrating a method of manufacturing a semiconductor device according to an embodiment of the present disclosure.

FIGS. 4A to 4D are sectional views illustrating a method of manufacturing a semiconductor device according to an embodiment of the present disclosure.

FIGS. 5A to 5C are sectional views illustrating a method of manufacturing a semiconductor device in accordance with an embodiment of the present disclosure.

DETAILED DESCRIPTION

Figure 1A:
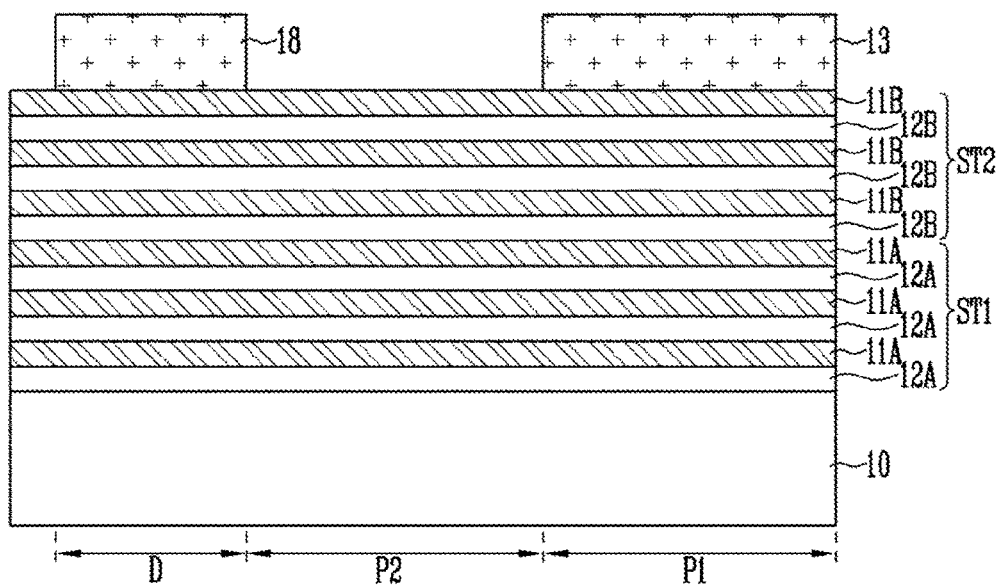
FIGS. 1A to 1E are sectional views illustrating a method of manufacturing a semiconductor device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, the element can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but the descriptions should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIGS. 1A to 1E are sectional views illustrating a method of manufacturing a semiconductor device according to an embodiment of the present disclosure.

Referring to FIG. 1A, a first stack ST1 in which a first pad region P1, a second pad region P2, and a dummy region D are successively defined is formed on a substrate 10. The substrate 10 may include a lower structure such as a well, a source, a pipe transistor, or a peripheral circuit.

The first pad region P1 is a region in which a first pad structure including stacked pads with a stepped shape is to be formed. The second pad region P2 is a region in which a second pad structure including stacked pads with a stepped shape is to be formed. Furthermore, the first and second pad regions P1 and P2 are regions in which contact plugs are to be formed. The contact plugs may be electrically coupled with the respective pads.

The dummy region D is a region in which a reference pattern for alignment of a mask is to be formed. The dummy region D may have a width less than that of the first or second pad region P1 or P2. In the case where the peripheral circuit is disposed below the first stack ST1, the peripheral circuit may be coupled with a cell array through the dummy region D. For example, the peripheral circuit is coupled with the cell array by contact plugs passing through the dummy region D of the first stack ST1.

The first stack ST1 may include first material layers 11A and second material layers 12A which are alternately stacked. The first material layers 11A may be provided to form gate electrodes of memory cells, select transistors, and the like. The second material layers 12A may be provided to insulate the stacked gate electrodes from each other. Here, the first material layers 11A are made of material having a high etching selectivity with respect to the second material layers 12A. For example, the first material layers 11A may be sacrificial layers including nitride or the like, and the second material layers 12A may be insulating layers including oxide or the like. Alternatively, the first material layers 11A may be conductive layers including polysilicon, tungsten, or the like, and the second material layers 12A may be insulating layers including oxide or the like. As a further alternative, the first material layers 11A may be conductive layers including doped polysilicon or the like, and the second material layers 12A may be sacrificial layers including undoped polysilicon or the like.

Thereafter, a second stack ST2 is formed on the first stack ST1. The second stack ST2 may include a first pad region P1, a second pad region P2, and a dummy region D which are successively defined. The first pad region P1, the second pad region P2, and the dummy region D of the second stack ST2 may be respectively disposed to correspond to the first pad region P1, the second pad region P2, and the dummy region D of the first stack ST1.

The second stack ST2 may include first material layers 11B and second material layers 12B which are alternately stacked. The first material layers 11B may be provided to form gate electrodes of memory cells, select transistors, and the like. The second material layers 12B may be provided to insulate the stacked gate electrodes from each other. Here, the first material layers 11B are made of material having a high etching selectivity with respect to the second material layers 12B. For example, the first material layers 11B may be sacrificial layers including nitride or the like, and the second material layers 12B may be insulating layers including oxide or the like. Alternatively, the first material layers 11B may be conductive layers including polysilicon, tungsten, or the like, and the second material layers 12B may be insulating layers including oxide or the like. As a further alternative, the first material layers 11B may be conductive layers including doped polysilicon or the like, and the second material layers 12B may be sacrificial layers including undoped polysilicon or the like.

The first and second stacks ST1 and ST2 may be provided to form memory strings including memory cells which are vertically stacked, and may form a shape having a high aspect ratio. The first material layers 11A and the first material layers 11B may be made of the same material. The second material layers 12A and the second material layers 12B may be made of the same material.

Thereafter, a first pad mask pattern 13 and a reference mask pattern 18 are formed on the second stack ST2. The first pad mask pattern 13 may be disposed in the first pad region P1 of the second stack ST2. The reference mask pattern 18 may be disposed in the dummy region D of the second stack ST2.

Figure 1B:
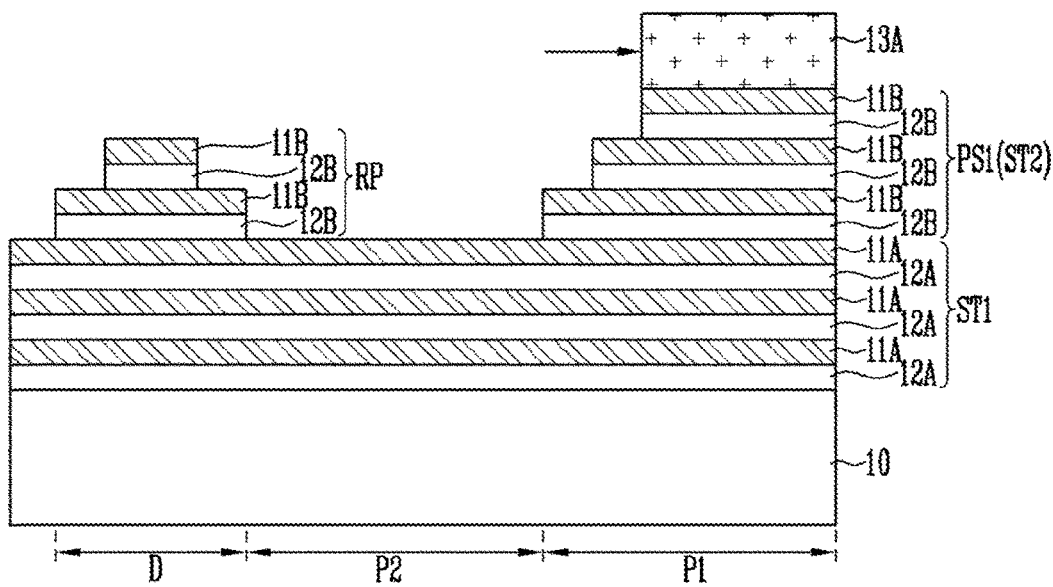

Referring to FIG. 1B, the second stack ST2 is partially etched using the first pad mask pattern 13 as an etch barrier. For example, at least one first material layer 11B and at least one second material layer 12B are etched. Subsequently, the first pad mask pattern 13 is shrunk. For instance, the first pad mask pattern 13 is etched a predetermined width, whereby the first pad mask pattern 13 is shrunk in one direction (refer to the arrow). Thereafter, the second stack ST2 is partially etched using a shrunk first pad mask pattern 13A as an etch barrier. As the process of shrinking the first pad mask pattern 13A and etching a portion of the second stack ST2 is repeatedly performed, the second stack ST2 is patterned. In this way, a first pad structure PS1 is formed to have a stepped shape such that at least a portion of each of the first material layers 11B is exposed. The first pad structure PS1 of the second stack ST2 may be disposed on the first pad region P1 of the first stack ST1.

During the process of forming the first pad structure PS1, a reference pattern RP may be formed by patterning the dummy region D of the second stack ST2 using the reference mask pattern 18 as an etch barrier. The reference pattern RP may be disposed on the dummy region D of the first stack ST1.

For example, during the process of shrinking the first pad mask pattern 13, the reference mask pattern 18 is shrunk together with the first pad mask pattern 13. During this process, the reference pattern RP may be formed to have a stepped shape. In the case where the reference mask pattern 18 has a width less than that of the first pad mask pattern 13, the reference mask pattern 18 may be completely removed during the process of repeatedly shrinking the first pad mask pattern 13. Therefore, the dummy region D of the second stack ST2 is patterned after the reference mask pattern 18 has been removed, and the reference pattern RP may be transferred to a lower layer. As a result, the reference pattern RP may have a height lower than that of the first pad structure PS1. In other words, an upper surface of the reference pattern RP may be disposed at a position lower than that of the first pad structure PS1.

Figure 1C:
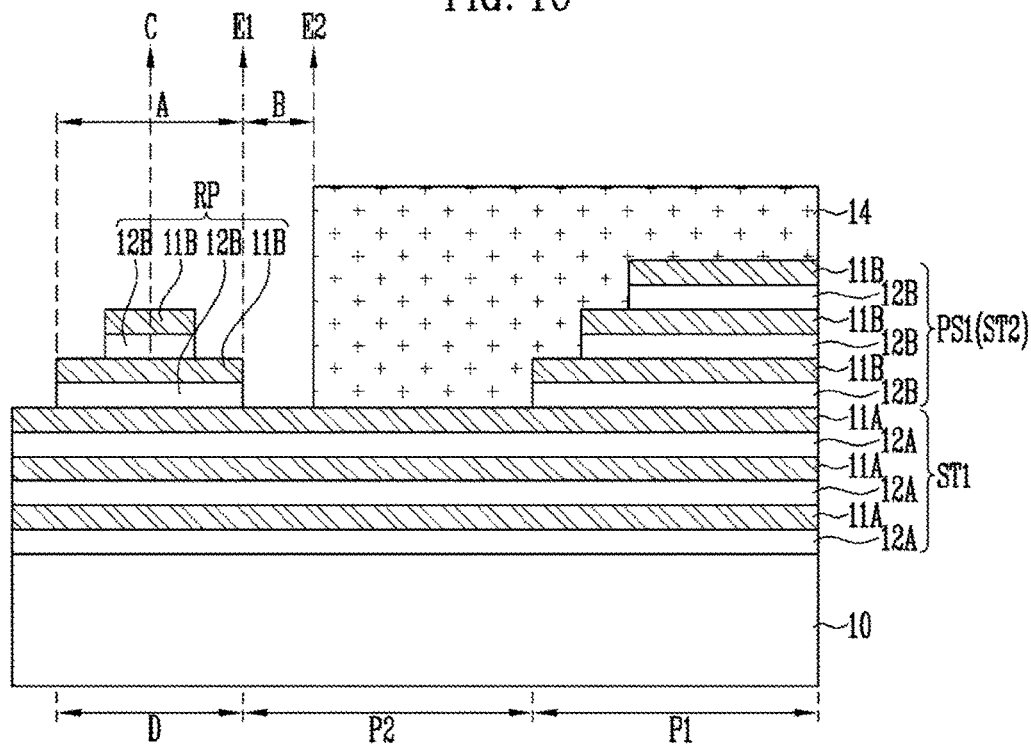

Referring to FIG. 1C, a second pad mask pattern 14 is formed on the first stack ST1. The second pad mask pattern 14 is formed to cover the first and second pad regions P1 and P2 such that the reference pattern RP remains exposed. Because the second pad mask pattern 14 is provided to form the second pad structure, the second pad mask pattern 14 must be formed taking into account the position of the already-formed first pad structure PS1. In particular, because the second pad structure is formed by shrinking the second pad mask pattern 14 after the first pad structure PS1 has been formed by shrinking the first pad mask pattern 13, there is a need for checking the position of the second pad mask pattern 14 and a degree of misalignment of the second pad mask pattern 14 in comparison with the first pad mask pattern 13.

To achieve the above-mentioned purpose, in an embodiment of the present disclosure, the second pad mask pattern 14 is aligned by measuring the distance from the reference pattern RP to the second pad mask pattern 14. The reference pattern RP is formed when the first pad mask pattern 13 is formed. Therefore, in the case where the second pad mask pattern 14 is aligned using the reference pattern RP, it has the same effect as directly aligning the second pad mask pattern 14 with the first pad mask pattern 13.

A reference point is set using the reference pattern RP, and a distance from the reference point to the second pad mask pattern 14 is measured. In this way, the second pad mask pattern 14 may be aligned at a desired position.

For example, a center C of the reference pattern RP is set as the reference point, and the distance between the reference point and an edge E2 of the second pad mask pattern 14 is measured to align the second pad mask pattern 14. In the case where the width of the reference pattern RP is designated as "A", and the distance between an edge E1 of the reference pattern RP and the edge E2 of the second pad mask pattern 14 which face each other is designated as "B", the second pad mask pattern 14 may be aligned at a position spaced apart from the reference point by "A/2+B".

In another embodiment, the edge E1 of the reference pattern RP may be set as the reference point, and the distance between the reference point and an edge E2 of the second pad mask pattern 14 may be measured to align the second pad mask pattern 14. In this case, the second pad mask pattern 14 may be aligned at a position spaced apart from the reference point by "B".

Figure 1D:
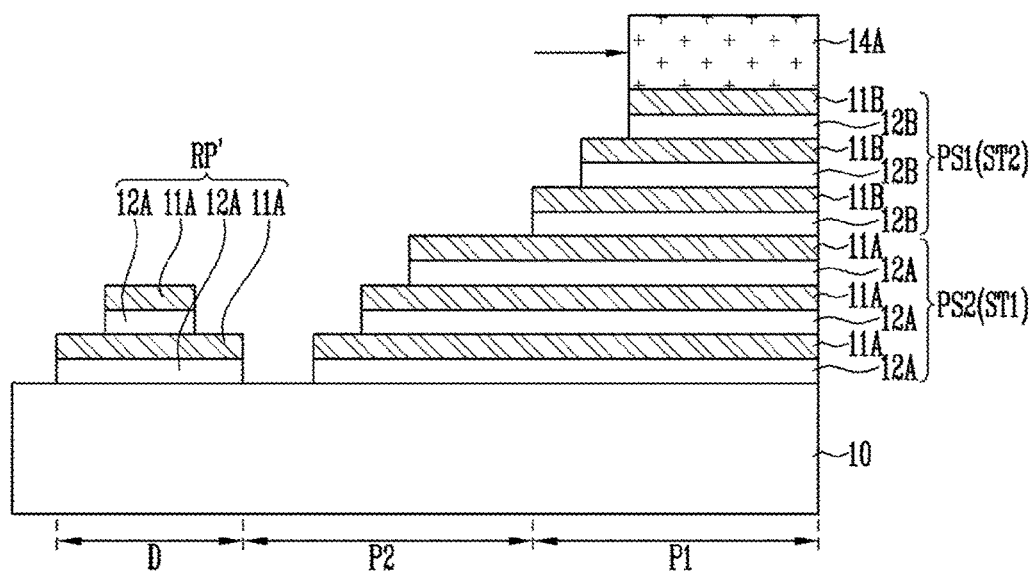

Referring to FIG. 1D, the first stack ST1 is partially etched using the second pad mask pattern 14 as an etch barrier. For example, at least one first material layer 11A and at least one second material layer 12A are etched. Subsequently, the second pad mask pattern 14 is shrunk. For instance, the second pad mask pattern 14 is etched by a predetermined width, whereby the second pad mask pattern 14 is shrunk in one direction (refer to the arrow). Thereafter, the first stack ST1 is partially etched using a shrunk second pad mask pattern 14A as an etch barrier. As the process of shrinking the second pad mask pattern 14A and etching a portion of the first stack ST1 is repeatedly performed, the second pad region P2 of the first stack ST1 is patterned. In this way, a second pad structure PS2 is formed to have a stepped shape such that at least a portion of each of the first material layers 11A is exposed.

Because the second pad mask pattern 14 is aligned with the first pad mask pattern 13 using the reference pattern RP, the second pad mask pattern 14 may be shrunk in the same direction as the first pad mask pattern 13 is shrunk. Therefore, a stepped structure of the first pad structure PS1 is aligned with a stepped structure of the second pad structure PS2, and the second pad structure PS2 has a shape extending in the same direction as that of the first pad structure PS1.

During the process of forming the second pad structure PS2, the reference pattern RP may be transferred to the first stack ST1. Here, the reference pattern RP may be transferred without an additional mask pattern, and the transferred reference pattern RP' may be maintained in the same shape as that of the reference pattern RP or partially changed in shape.

Figure 1E:
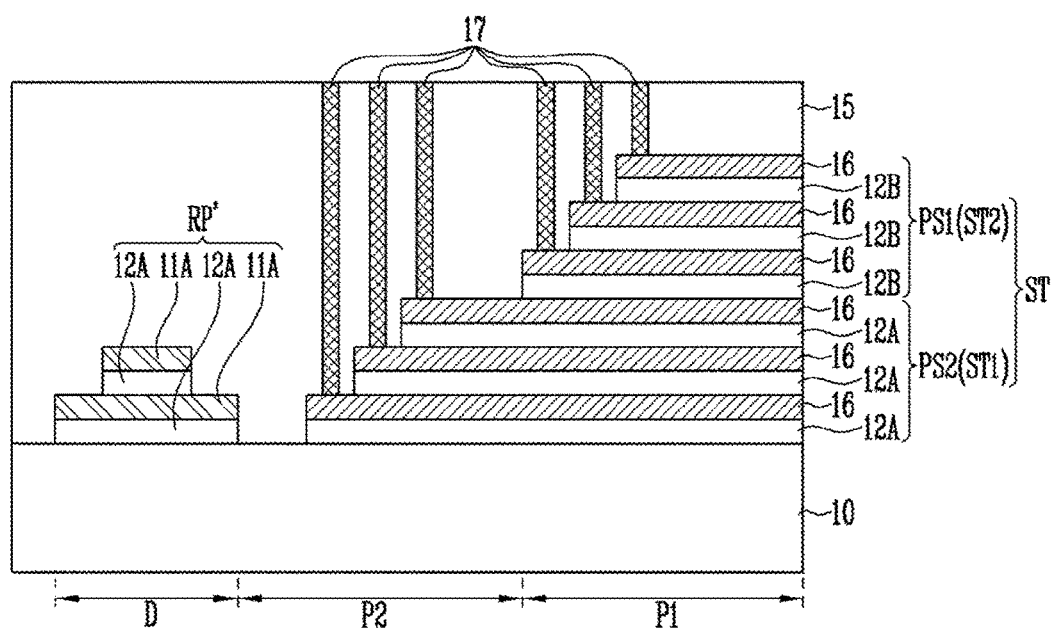

Referring to FIG. 1E, an interlayer insulating layer 15 is formed to cover a stack ST including the first and second pad structures PS1 and PS2. Subsequently, a slit (not shown) passing through the interlayer insulating layer 15 and the stack ST is formed. The first material layers 11A and 11B or the second material layers 12A and 12B of the stack ST are thereafter replaced with third material layers 16 through the slit. The first material layers 11A or the second material layers 12A included in the reference pattern RP' may also be replaced with third material layers 16, or remain without being replaced with the third material layers 16.

For example, in the case where the first material layers 11A and 11B are sacrificial layers and the second material layers 12A and 12B are insulating layers, conductive layers may substitute for the first material layers 11A and 11B through the slit. Alternately, in the case where the first material layers 11A and 11B are conductive layers and the second material layers 12A and 12B are insulating layers, the first material layers 11A and 11B may be silicidized through the slit. As a further alternative, in the case where the first material layers 11A and 11B are conductive layers and the second material layers 12A and 12B are sacrificial layers, insulating layers may substitute for the second material layers 12A and 12B.

Thereafter, contact plugs 17 which are electrically coupled with the respective third material layers 16 are formed to pass through the interlayer insulating layer 15. Each region of the third material layers 16 which are exposed by the stepped structures of the first and second pad structures PS1 and PS2 becomes a pad, and each pad is electrically coupled with at least one contact plug 17.

According to the above-mentioned manufacturing method, even when pad structures are formed by a plurality of pad mask patterns, the plurality of pad mask patterns may be easily aligned using the reference pattern RP. Therefore, the stepped shape of the pad structure may be easily controlled, and the pad and the contact plug may be prevented from being misaligned with each other.

In the embodiment, although there has been illustrated the case where two pad structures are formed by two pad mask patterns, it is possible to form three or more pad structures using three or more pad mask patterns. Furthermore, each pad structure may include three or more stepped layers, and the dummy region D may be disposed between the first pad region P1 and the second pad region P2.

FIGS. 2A to 2D are sectional views illustrating a method of manufacturing a semiconductor device according to an embodiment of the present disclosure. Hereinbelow, repetitive explanation will be omitted if deemed redundant.

Referring to FIG. 2A, a first stack ST1 in which a first pad region P1, a second pad region P2, a first dummy region D1, a third pad region P3, and a second dummy region D2 are successively defined as formed on a substrate 20. Thereafter, a second stack ST2 is formed on the first stack ST1, and a third stack ST3 is formed on the second stack ST2. The second dummy region D2 may be spaced apart from the first dummy region D1 by a predetermined distance. The third pad region P3 may be disposed between the first dummy region D1 and the second dummy region D2.

Each of the second and third stacks ST2 and ST3 may also include a first pad region P1, a second pad region P2, a first dummy region D1, a third pad region P3, and a second dummy region D2 which are successively defined. The first pad regions P1, the second pad regions P2, the first dummy regions D1, the third pad regions P3, and the second dummy regions D2 of the first to third stacks ST1 to ST3 may be disposed to correspond to each other.

Each of the first to third pad regions P1 to P3 is a region in which a pad structure including stacked pads with a stepped structure is to be formed. Each of the first and second dummy regions D1 and D2 is a region in which a reference pattern for alignment of a mask that is to be formed. Each of the first and second dummy regions D1 and D2 may have a width less than that of each of the first to third pad regions P1 to P3.

The first stack ST1 may include first material layers 21A and second material layers 22A which are alternately stacked. The second stack ST2 may include first material layers 21B and second material layers 22B which are alternately stacked. The third stack ST3 may include first material layers 21C and second material layers 22C which are alternately stacked. The first material layers 21A to 21C may be made of the same material. The second material layers 22A to 22C may be made of the same material.

Thereafter, a first pad mask pattern 23, a first reference mask pattern 28, and a second reference mask pattern 29 are formed on the third stack ST3. The first pad mask pattern 23 may be disposed on the first pad region P1 of the third stack ST3. The first reference mask pattern 28 may be disposed on the first dummy region D1 of the third stack ST3. The second reference mask pattern 29 may be disposed on the second dummy region D2 of the third stack ST3.

Figure 2B:
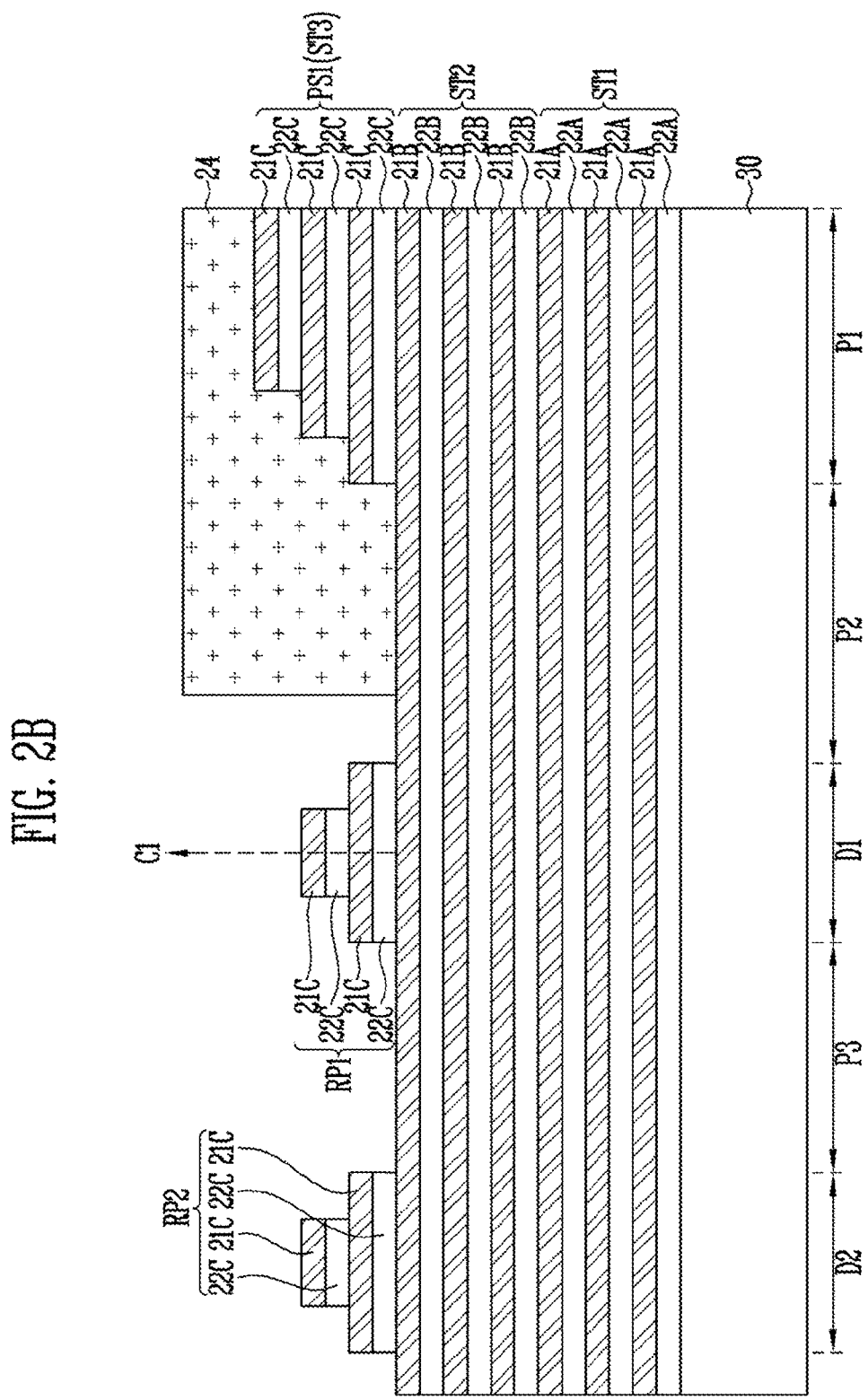

Referring to FIG. 2B, while the first pad mask pattern 23 is shrunk, the third stack ST3 is patterned so that a first pad structure PS1 having a stepped shape is formed. The first pad structure PS1 of the third stack ST3 may be disposed on the first pad region P1 of the second stack ST2.

During the process of forming the first pad structure PS1, a first reference pattern RP1 may be formed by patterning the first dummy region D1 of the third stack ST3 using the first reference mask pattern 28 as an etch barrier. In addition, a second reference pattern RP2 may be formed by patterning the second dummy region D2 of the third stack ST3 using the second reference mask pattern 29 as an etch barrier. Further, in one embodiment, the second reference pattern RP2 may be formed when the when the first reference pattern RP1 is formed.

The first and second reference patterns RP1 and RP2 may be respectively disposed on the first and second dummy regions D1 and D2 of the second stack ST2. Each of the first and second reference patterns RP1 and RP2 may have a height lower than that of the first pad structure PS1. In other words, upper surfaces of the first and second reference patterns RP1 and RP2 may be disposed at a position lower than that of the first pad structure PS1.

Subsequently, the first pad mask pattern 23 is removed, and a second pad mask pattern 24 is thereafter formed on the second stack ST2. The second pad mask pattern 24 is aligned by measuring the distance from the first or second reference pattern RP1 or RP2 to the second pad mask pattern 24. For example, a center C1 of the first reference pattern RP1 is set as a reference point, and the second pad mask pattern 24 may be aligned using the reference point. The second pad mask pattern 24 is disposed to cover the first and second pad regions P1 and P2 such that the first and second reference patterns RP1 and RP2 are exposed.

Figure 2C:
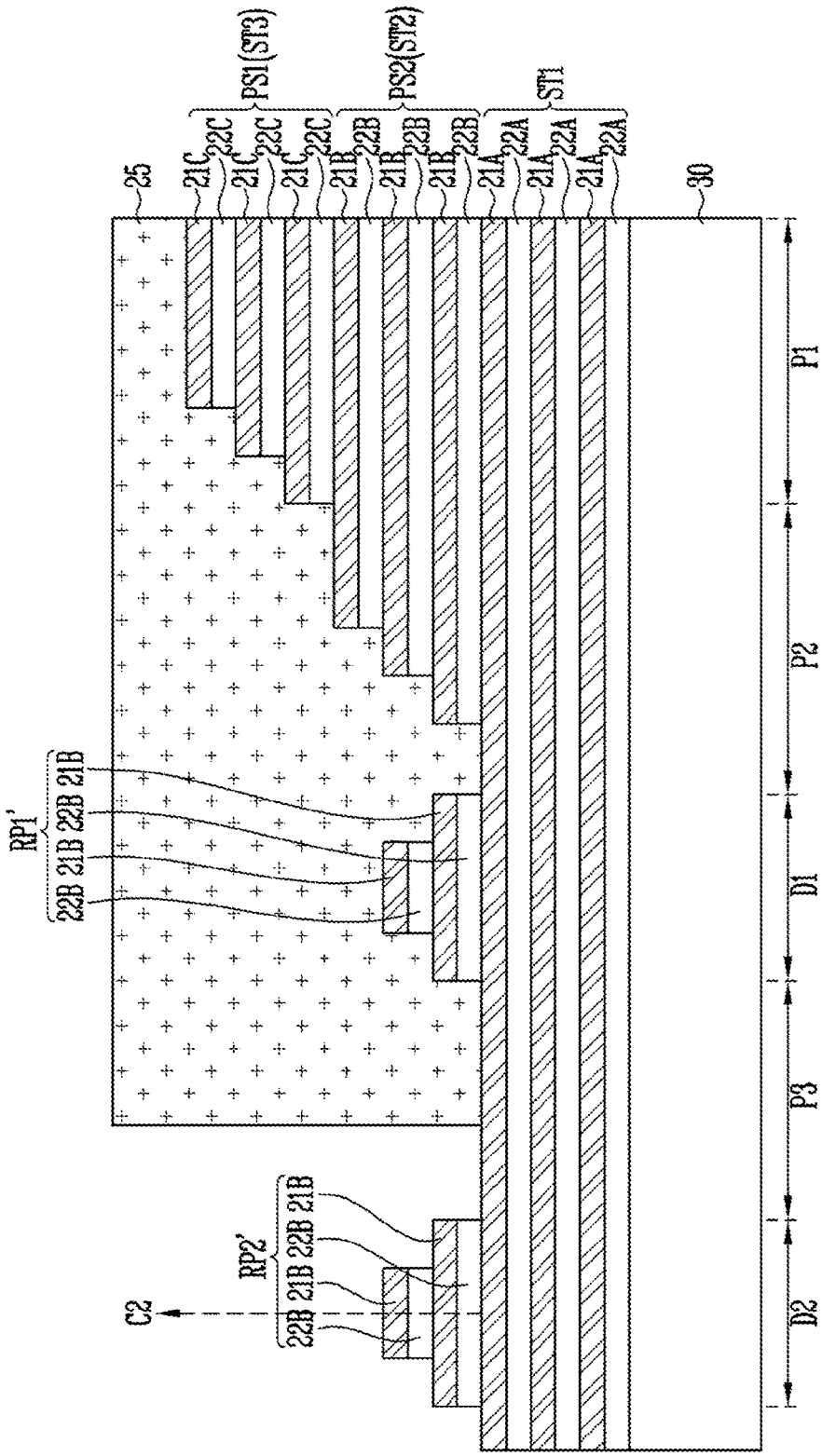

Referring to FIG. 2C, a second pad structure PS2 having a stepped shape is formed by patterning the second stack ST2 while shrinking the second pad mask pattern 24. The second pad structure PS2 of the second stack ST2 may be disposed on the second pad region P2 of the first stack ST1.

During the process of forming the second pad structure PS2, the first dummy region D1, the third pad region P3, and the second dummy region D2 of the second stack ST2 are etched. Therefore, the first reference pattern RP1 and the second reference pattern RP2 may be transferred to the second stack ST2. Each of the transferred first and second reference patterns RP1' and RP2' may have a height lower than that of the second pad structure PS2. In other words, upper surfaces of the first and second reference patterns RP1' and RP2' may be disposed at a position lower than that of the second pad structure PS2.

The transferred first and second reference patterns RP1' and RP2' may respectively have substantially the same shapes as those of the first and second reference patterns RP1 and RP2. Even when shapes of the first and second reference patterns RP1' and RP2' are partially changed during the transferring process, the position of the center of the first and second reference patterns RP1' and RP2' are not changed.

Subsequently, the second pad mask pattern 24 is removed, and a third pad mask pattern 25 is thereafter formed on the first stack ST1 after forming the second pad structure PS2. The third pad mask pattern 25 is aligned by measuring the distance from the second reference pattern RP2' to the third pad mask pattern 25. For example, a center C2 of the second reference pattern RP2 is set as a reference point, and the third pad mask pattern 25 may be aligned using the reference point. The third pad mask pattern 25 is disposed to cover the first to third pad regions P1 to P3 and the first dummy region D1 such that the second reference pattern RP2' remains exposed.

Referring to FIG. 2D, a third pad structure PS3 having a stepped shape is formed by patterning the first stack ST1 while shrinking the third pad mask pattern 25. The third pad region P3 of the first stack ST1 is patterned, whereby the third pad structure PS3 is formed. The second reference pattern RP2' is transferred to the second dummy region D2 of the first stack ST1.

Subsequently, the third pad mask pattern 25 is removed. Thereafter, additional processes such as a process of replacing the first material layers 21A to 21C or the second material layers 22A to 22C with third material layers, and a process of forming contact plugs may be performed.

According to the above-described process, a plurality of reference patterns are formed when the first pad structure PS1 is formed. Therefore, a plurality of mask patterns may be easily aligned using the plurality of reference patterns.

FIGS. 3A to 3D are sectional views illustrating a method of manufacturing a semiconductor device according to an embodiment of the present disclosure. Hereinbelow, repetitive explanation will be omitted if deemed redundant.

Referring to FIG. 3A, a first stack ST1 in which a first pad region P1, a second pad region P2, a first dummy region D1, a third pad region P3, and a second dummy region D2 are successively defined is formed on a substrate 30. Thereafter, a second stack ST2 is formed on the first stack ST1, and a third stack ST3 is formed on the second stack ST2. Each of the first to third stacks ST1 to ST3 may include first material layers 31A, 31B, 31C and second material layers 32A, 32B, 32C which are alternately stacked.

Thereafter, a first pad mask pattern 33 and a first reference mask pattern 38 are formed on the third stack ST3. The first pad mask pattern 33 may be disposed on the first pad region P1 of the third stack ST3. The first reference mask pattern 38 may be disposed on the first dummy region D1 of the third stack ST3.

Figure 3B:
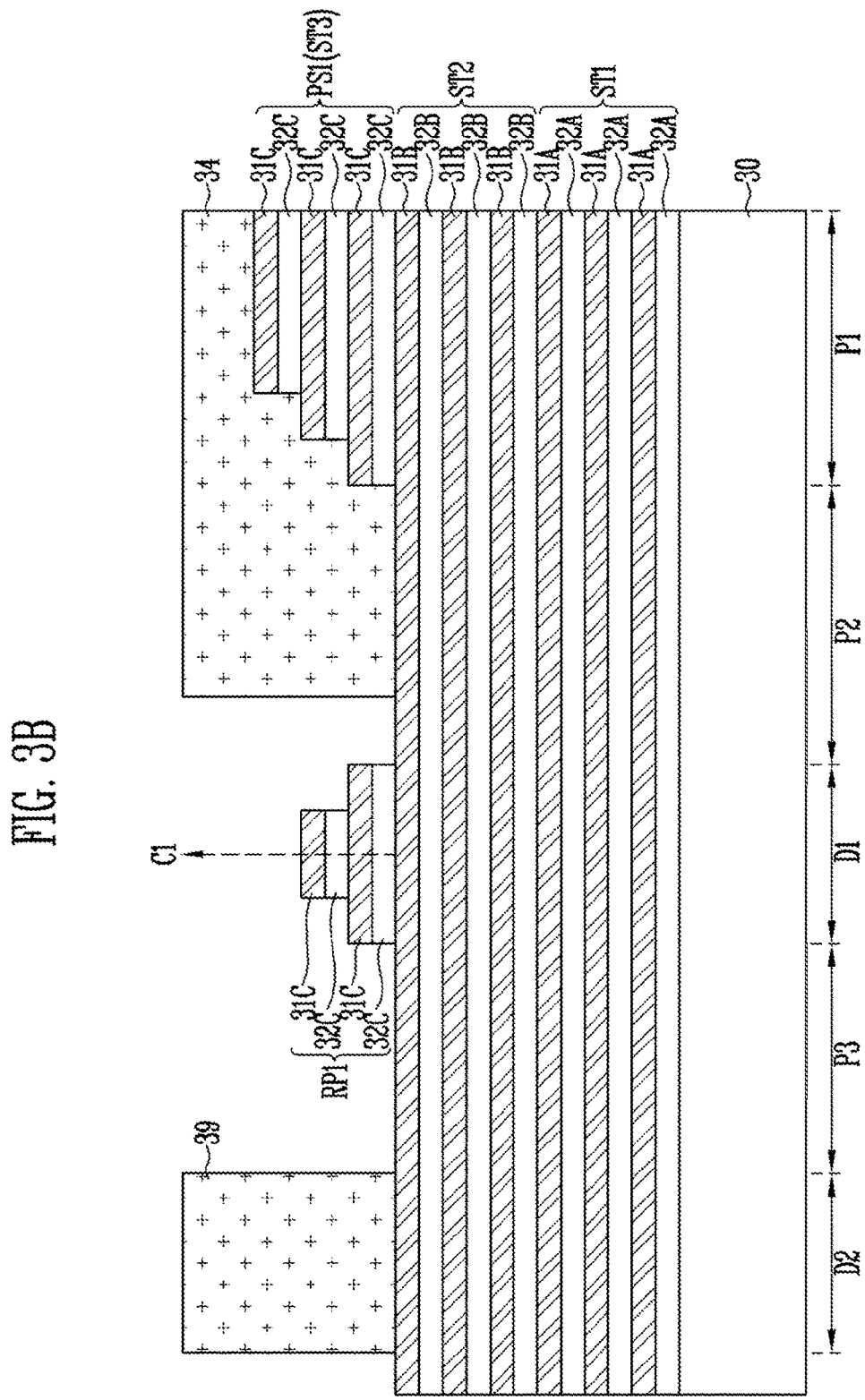

Referring to FIG. 3B, a first pad structure PS1 having a stepped shape is formed by patterning the third stack ST3 while shrinking the first pad mask pattern 33. The first pad structure PS1 of the third stack ST3 may be disposed on the first pad region P1 of the second stack ST2.

During the process of forming the first pad structure PS1, a first reference pattern RP1 may be formed by patterning the first dummy region D1 of the third stack ST3 using the first reference mask pattern 38 as an etch barrier.

Subsequently, the first pad mask pattern 33 is removed, and a second pad mask pattern 34 is thereafter formed on the second stack ST2. The second pad mask pattern 34 is aligned by measuring a distance from the first reference pattern RP1 to the second pad mask pattern 34. For example, a center C1 of the first reference pattern RP1 is set as a reference point, and the second pad mask pattern 34 is aligned using the reference point. The second pad mask pattern 34 is disposed to cover the first and second pad regions P1 and P2 such that the first reference pattern RP1 remains exposed.

When the second pad mask pattern 34 is formed, a second reference mask pattern 39 may be formed along with the second pad mask pattern 34 on the second dummy region D2 of the second stack ST2. The second reference mask pattern 39 may be aligned by measuring a distance from the first reference pattern RP1 to the second reference mask pattern 39. For example, a center C1 of the first reference pattern RP1 is set as a reference point, and the second reference mask pattern 39 is aligned using the reference point.

Figure 3C:
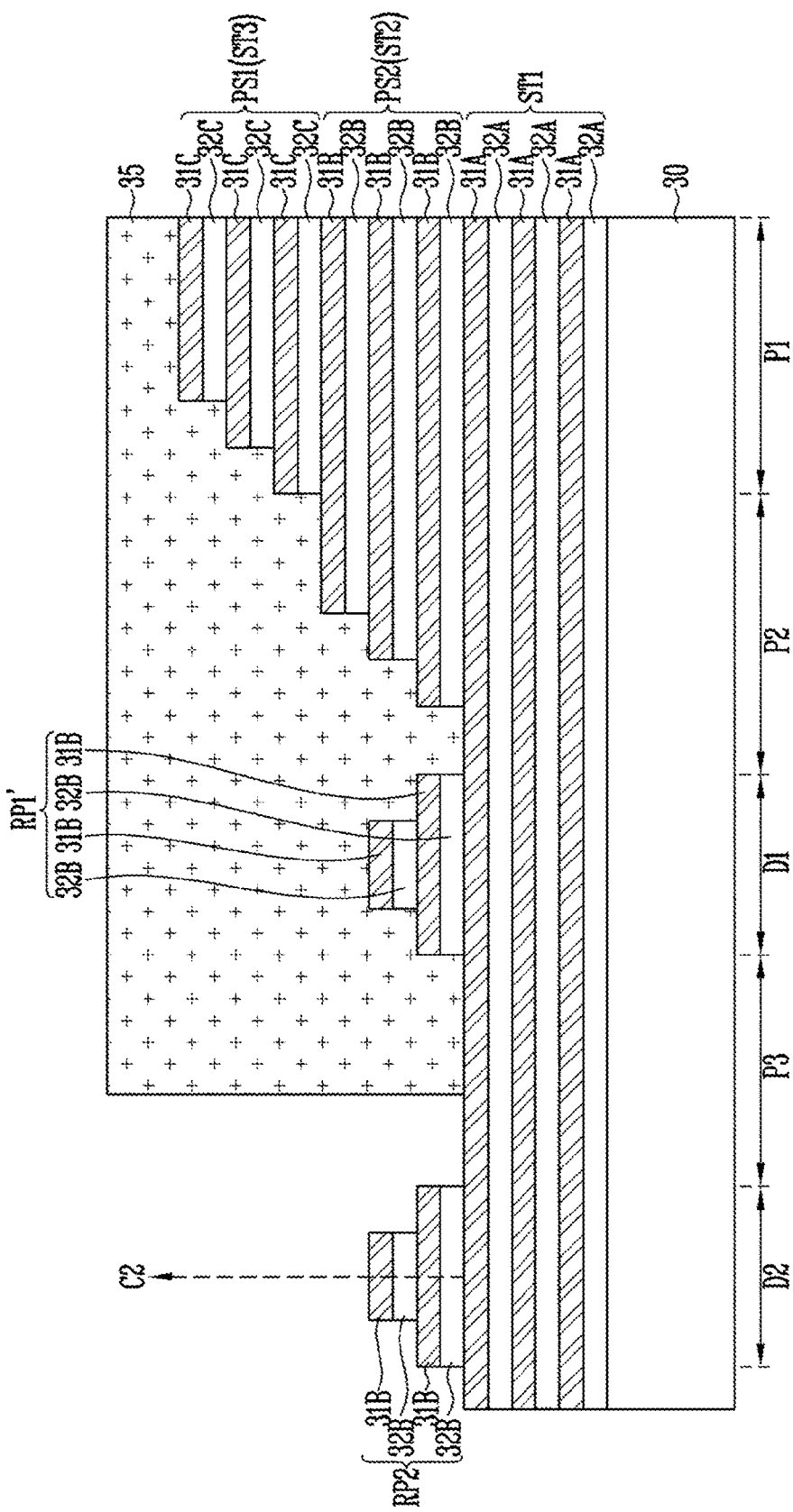

Referring to FIG. 3C, a second pad structure PS2 having a stepped shape is formed by patterning the second stack ST2 while shrinking the second pad mask pattern 34. The second pad structure PS2 of the second stack ST2 may be disposed on the second pad region P2 of the first stack ST1.

During the process of forming the second pad structure PS2, a second reference pattern RP2 may be formed by patterning the second dummy region D2 of the second stack ST2 using the second reference mask pattern 39 as an etch barrier. Thus, the second reference pattern RP2 may be formed by patterning the second dummy region D2 of the second stack ST2 when the second pad structure PS2 is formed.

Subsequently, the second pad mask pattern 34 is removed, and a third pad mask pattern 35 is thereafter formed on the first stack ST1. The third pad mask pattern 35 is aligned by measuring a distance from the second reference pattern RP2 to the third pad mask pattern 35. For example, a center C2 of the second reference pattern RP2 is set as a reference point, and the third pad mask pattern 35 is aligned using the reference point. The third pad mask pattern 35 may be disposed to cover the first and third pad regions P1 to P3 and the first dummy region D1 such that the second reference pattern RP2 remains exposed.

Figure 3D:
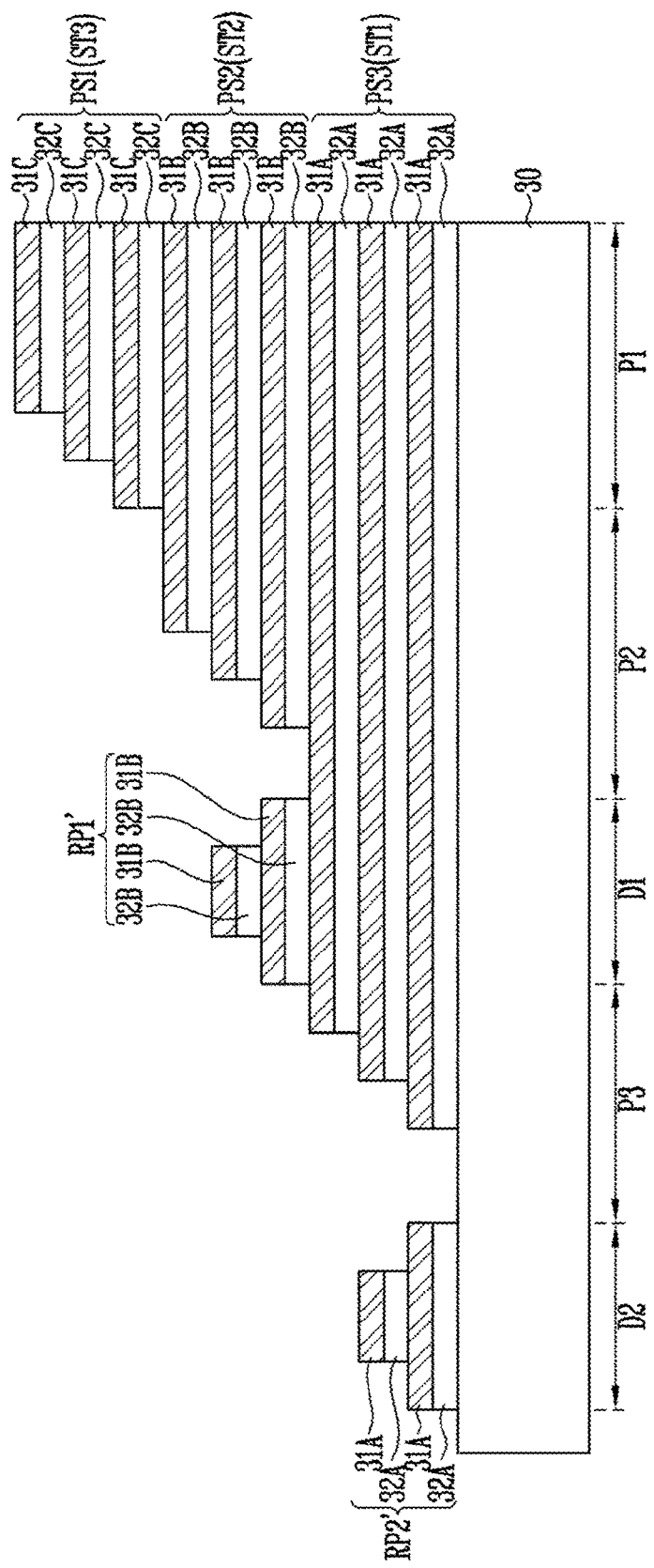

Referring to FIG. 3D, a third pad structure PS3 having a stepped shape is formed by patterning the first stack ST1 while shrinking the third pad mask pattern 35. The third pad structure PS3 is formed by patterning the third pad region P3 of the first stack ST1. The second reference pattern RP2 is transferred to the second dummy region D2 of the first stack ST1.

Subsequently, the third pad mask pattern 35 is removed. Thereafter, additional processes such as a process of replacing the first material layers 31A to 31C or the second material layers 32A to 32C with third material layers, and a process of forming contact plugs may be performed.

According to the above-mentioned process, the first reference pattern RP1 is formed when the first pad structure PS1 is formed, and the second reference pattern RP2 is formed when the second pad structure PS2 is formed. Therefore, deformation of the reference pattern may be minimized during the process of transferring the reference pattern to a lower layer.

FIGS. 4A to 4D are sectional views illustrating a method of manufacturing a semiconductor device according to an embodiment of the present disclosure. Hereinbelow, repetitive explanation will be omitted if deemed redundant.

Referring to FIG. 4A, a first stack ST1 in which a first pad region P1, a second pad region P2, and a dummy region D are successively defined is formed on a substrate 40. Thereafter, a second stack ST2 is formed on the first stack ST1. Each of the first and second stacks ST1 and ST2 may include first material layers 41A, 41B and second material layers 42A, 42B which are alternately stacked.

Thereafter, a first pad mask pattern 43, a first reference mask pattern 48, and a second reference mask pattern 49 are formed on the second stack ST2. The first pad mask pattern 43 may be disposed on the first pad region P1 of the second stack ST2. The first reference mask pattern 48 may be disposed at a position spaced apart from the second reference mask pattern 49 by a predetermined distance. Both the first and second reference mask patterns 48 and 49 may be disposed on the dummy region D of the second stack ST2.

Figure 4B:
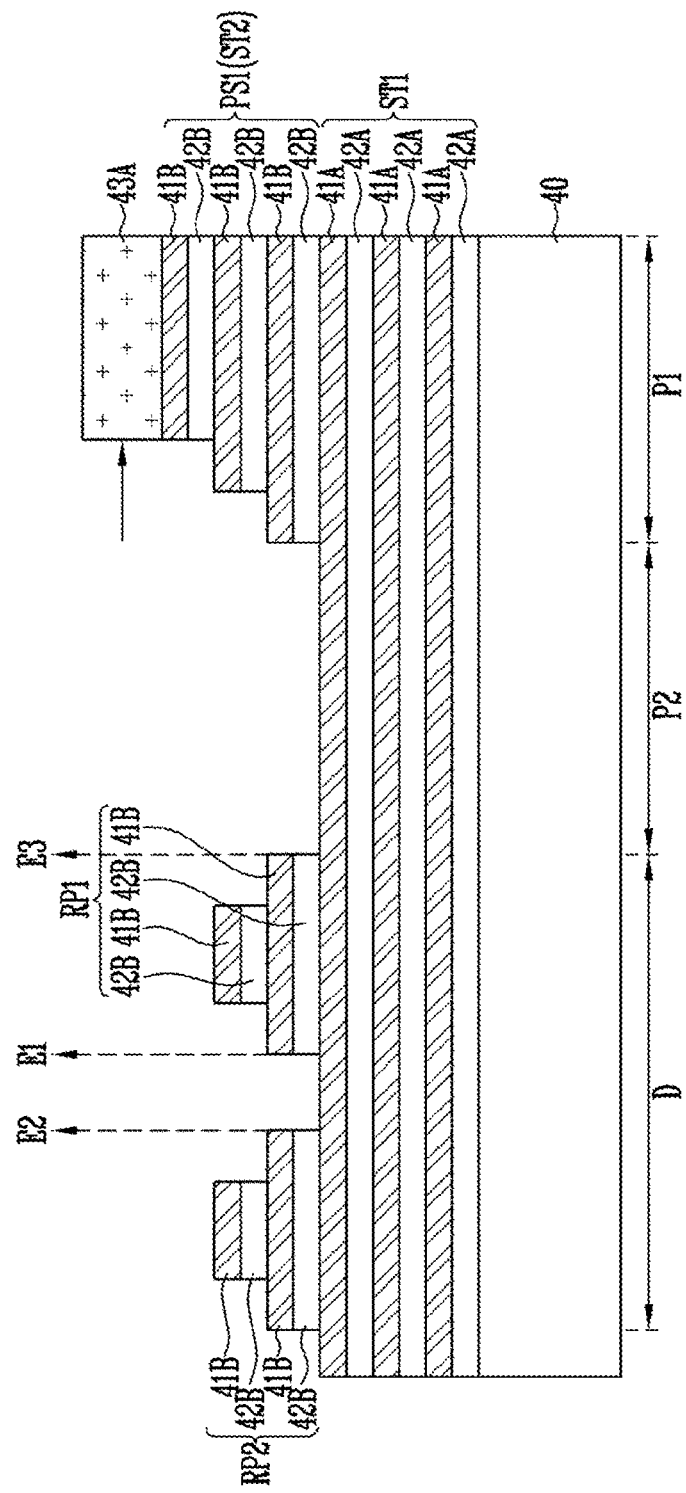

Referring to FIG. 4B, a first pad structure PS1 having a stepped shape is formed by patterning the second stack ST2 while shrinking the first pad mask pattern 43 in one direction (refer to the arrow). The first pad structure PS1 of the second stack ST2 may be disposed on the first pad region P1 of the first stack ST1.

During the process of forming the first pad structure PS1, first and second reference patterns RP1 and RP2 may be formed by patterning the dummy region D of the second stack ST2 using the first and second reference mask patterns 48 and 49 as etch barriers. The first reference pattern RP1 may be disposed at a position spaced apart from the second reference pattern RP2 by a predetermined distance. Both the first and second reference patterns RP1 and RP2 may be disposed on the dummy region D of the first stack ST1.

During a process of repeatedly performing an etching process to form the first pad structure PS1, the first and second reference mask patterns 48 and 49 may be removed, and the first and second reference patterns RP1 and RP2 may be transferred to a lower layer. However, during the process of repeatedly performing the etching process, shapes of the transferred first and second reference patterns PR1 and PR2 may change based on peripheral patterns. For example, the first pad structure PS1 is disposed around a third edge E3 of the first reference pattern PR1, and each time the etching process is repeated, a distance between the third edge E3 and the first pad structure PS1 is changed. As a result, during the process of repeatedly performing the etching process, the third edge E3 may be deformed or may be pushed in one direction. On the other hand, the second reference pattern PR2 is disposed around a first edge E1 of the first reference pattern PR1, and the first reference pattern PR1 is disposed around a second edge E2 of the second reference pattern PR2. In this case, because the first edge E1 and the second edge E2 are under the same conditions during the process of repeatedly performing the etching process, the first edge E1 and the second edge E2 are less likely to be deformed even when a process of transferring the reference patterns is performed after the first and second reference mask patterns 48 and 49 have been removed.

Figure 4C:
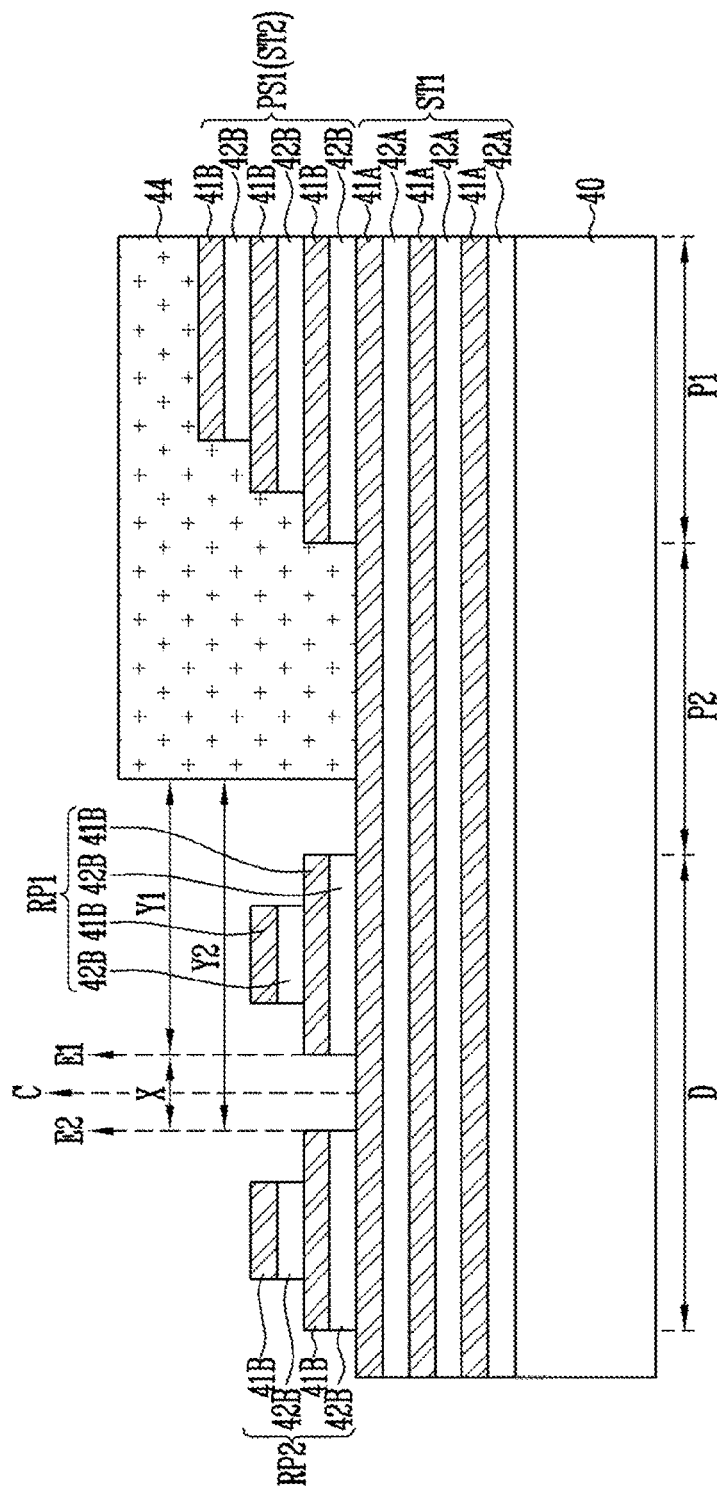

Referring to FIG. 4C, a shrunk first pad mask pattern 43A is removed, and a second pad mask pattern 44 is thereafter formed on the first stack ST1. The second pad mask pattern 44 is disposed to cover the first and second pad regions P1 and P2 such that the first and second reference patterns RP1 and RP2 are exposed.

The second pad mask pattern 44 is aligned by measuring a distance from the first or second reference pattern RP1 or RP2 to the second pad mask pattern 44. A reference point may be disposed at a position between the first reference pattern RP1 and the second reference pattern RP2 at which the first and second edges E1 and E2 are less likely to be deformed. In another example, the second pad mask pattern 44 may be aligned by measuring a distance between the second pad mask pattern 44 and a reference point disposed between the first reference pattern RP1 and the second reference pattern RP2.

For example, the reference point may be disposed at a center C at which the distance between the center of the first reference pattern RP1 and the center of the second reference pattern RP2 is divided into two equal parts. In the case where the distance between the first edge E1 of the first reference pattern RP1 and the second edge E2 of the second reference pattern RP2 which face each other is designated as "X", and a distance between the first edge E1 and the second pad mask pattern 44 is designated as "Y1", the second pad mask pattern 44 is aligned at a position spaced apart from the reference point by X/2+Y1.

Alternately, the first edge E1 of the first reference pattern RP1 or the second edge E2 of the second reference pattern RP2 that face each other is set as a reference point, and the second pad mask pattern 44 is aligned using the reference point. In the case where the first edge E1 is set as a reference point, the second pad mask pattern 44 is aligned at a position spaced apart from the reference point by "Y1". In the case where the second edge E2 is set as the reference point, the second pad mask pattern 44 is aligned at a position spaced apart from the reference point by "Y2".

Figure 4D:
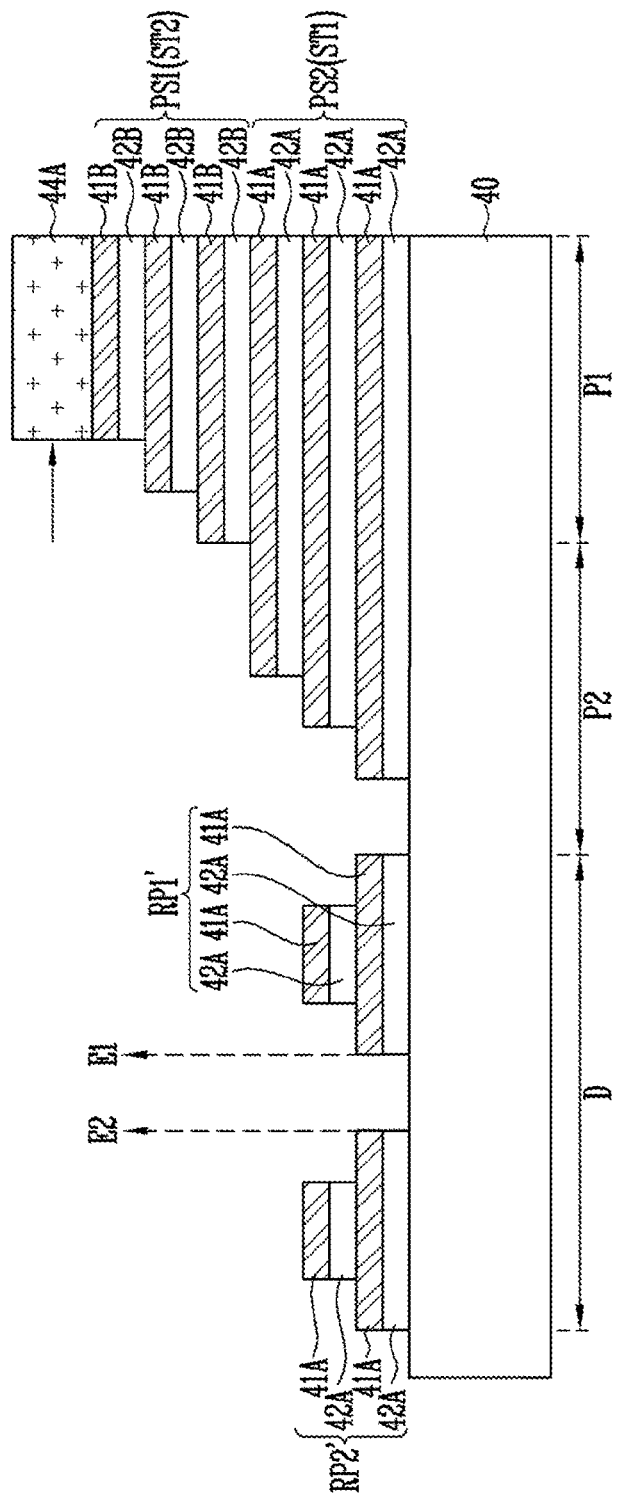

Referring to FIG. 4D, a second pad structure PS2 having a stepped shape is formed by patterning the first stack ST1 while shrinking the second pad mask pattern 44. The second pad structure PS2 is formed by patterning the second pad region P2 of the first stack ST1. The first and second reference patterns RP1 and RP2 are transferred to the dummy region D of the first stack ST1.

Since the first and second edges E1 and E2 of the first and second reference patterns RP1 and RP2 are transferred to a lower layer under the same conditions, profiles thereof may be maintained without being deformed. Therefore, the first and second reference patterns RP1 and RP2 may be used as a reference pattern for aligning a mask pattern during a following process. For example, in the case where a third pad region is disposed between the dummy region D and the second pad region P2, a third pad mask pattern aligned using the first and second reference patterns RP1 and RP2 may be formed, and a third pad structure may be thereafter formed using the third pad mask pattern.

Subsequently, a shrunk second pad mask pattern 44A is removed. Thereafter, additional processes such as a process of replacing the first material layers 41A and 41B or the second material layers 42A and 42B with third material layers, and a process of forming contact plugs may be performed.

According to the above-described process, a plurality of reference patterns are formed in the dummy region D and a reference point is set between the reference patterns. Therefore, even when the reference patterns are transferred to a lower layer, a position of the reference point may be prevented from being changed.

Figure 5C:
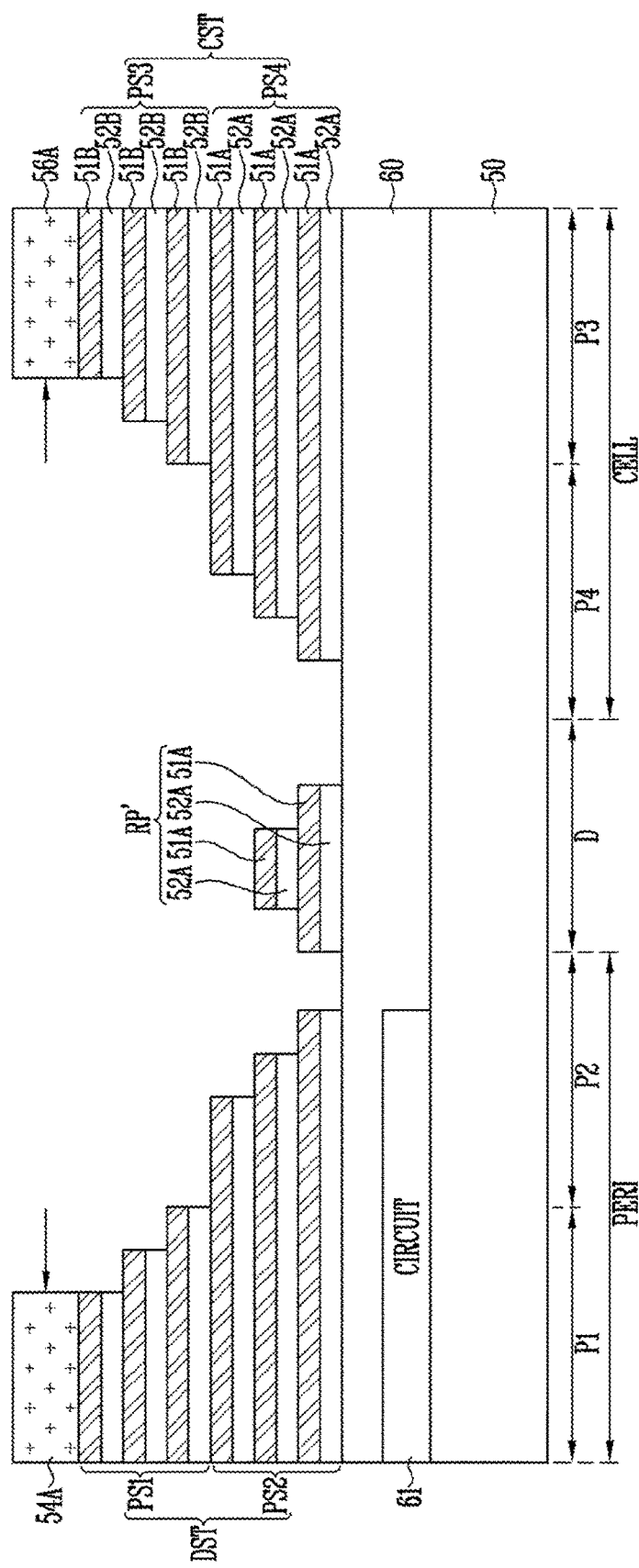

FIGS. 5A to 5C are sectional views illustrating a method of manufacturing a semiconductor device in accordance with an embodiment of the present disclosure.

Referring to FIG. 5A, before forming a first stack ST1, a circuit 61 is formed on a substrate 50 including a cell region CELL and a peripheral circuit region PERI, and an interlayer insulating layer 60 is thereafter formed on the substrate 50. A cell array including a plurality of memory strings may be disposed in the cell region CELL. The circuit 61, e.g., a transistor, a switch, a capacitor, or a pump, for driving the cell array may be disposed in the peripheral circuit region PERI.

Subsequently, the first stack ST1 which includes first and second pad regions P1 and P2 disposed in the peripheral circuit region PERI, third and fourth pad regions P3 and P4 disposed in the cell region CELL, and a dummy region D is formed. For example, the first stack ST1 may include the first pad region P1, the second pad region P2, the dummy region D, the fourth pad region P4, and the third pad region P3 which are successively defined. The dummy region D is disposed between the second pad region P2 and the fourth pad region P4. The dummy region D may be disposed between the cell region CELL and the peripheral circuit region PERI, or disposed in the peripheral circuit region PERI.

Thereafter, a second stack ST2 is formed on the first stack ST1. Each of the first and second stacks ST1 and ST2 may include first material layers 51A, 51B and second material layers 52A, 52B which are alternately stacked.

Thereafter, a first pad mask pattern 53, a reference mask pattern 58, and a second pad mask pattern 55 may be formed at the same time on the second stack ST2. The first pad mask pattern 53 may be disposed on the first pad region P1 of the second stack ST2. The second pad mask pattern 55 may have a mirror-symmetrical structure with the first pad mask pattern 53, and may be disposed on the third pad region P3 of the second stack ST2. The reference mask pattern 58 may be disposed on the dummy region D of the second stack ST2. In another example, the reference mask pattern 58 may be disposed closer to the second pad region P2 than to the fourth pad region P4, and may be at least partially disposed in the peripheral circuit region PERI.

Referring to FIG. 5B, each of the first pad mask pattern 53 and the second pad mask pattern 55 is shrunk in one direction (refer to the arrow of FIG. 5A), and the second stack ST2 is patterned in a stepped shape. As a result, a first pad structure PS1 is formed on the first pad region P1 of the first stack ST1, and a third pad structure PS3 is formed on the third pad region P3 of the first stack ST1. The first pad structure PS1 and the third pad structure PS3 may have a mirror-symmetrical structure, and the third pad structure PS3 may be formed when the first pad structure PS1 is formed.

During the process of forming the first and third pad structures PS1 and PS3, a reference pattern RP may be formed by patterning the dummy region D of the second stack ST2 using the reference mask pattern 58 as an etch barrier. The reference pattern RP may be disposed closer to the second pad region P2 than to the fourth pad region P4, and may be at least partially disposed in the peripheral circuit region PERI.

Subsequently, the shrunk first and second pad mask patterns 53 and 55 are removed, and third and fourth pad mask patterns 54 and 56 are thereafter formed on the first stack ST1. The third pad mask pattern 54 is formed to cover the first and second pad regions P1 and P2 of the first stack ST1. The fourth pad mask pattern 56 is formed to cover the third and fourth pad regions P3 and P4 of the first stack ST1. The reference pattern RP remains exposed rather than being covered by the third and fourth mask patterns 54 and 56.

The third pad mask pattern 54 or the fourth pad mask pattern 56 is aligned by measuring a distance from the reference pattern RP to the third pad mask pattern 54 or the fourth pad mask pattern 56. For example, a distance (refer to the arrow) from the reference pattern to the third pad mask pattern 54 is measured, and the third pad mask pattern 54 is aligned using the measured distance. The fourth pad mask pattern 56 and the third pad mask pattern 54 are simultaneously formed. In this case, because the fourth pad mask pattern 56 has a mirror-symmetrical structure with the third pad mask pattern 54, the fourth pad mask pattern 56 is aligned with the third pad mask pattern 54. Therefore, although a distance between the fourth pad mask pattern 56 and the reference pattern RP is not measured, the fourth pad mask pattern 56 may be easily aligned.

Referring to FIG. 5C, the first stack ST1 is patterned while the third and fourth pad mask patterns 54 and 56 are shrunk. In this way, the second pad region P2 of the first stack ST1 is patterned, whereby a second pad structure PS2 is formed. The fourth pad region P4 of the first stack ST1 is patterned, whereby a fourth pad structure PS4 is formed. The second pad structure PS2 and the fourth pad structure PS4 may have a mirror-symmetrical structure. Furthermore, a dummy stack DST including the first and second pad structures PS1 and PS2 and a cell stack CST including the third and fourth pad structures PS3 and PS4 are formed. The cell stack CST and the dummy stack DST may be symmetrically the same, in other words, the cell stack CST and the dummy stack DST may have a mirror-symmetrical structure.

The dummy region D of the first stack ST1 is etched, whereby the first pattern RP may be transferred to the dummy region D of the first stack ST1. The reference pattern RP may be disposed between the cell structure CST and the dummy structure DST, or disposed in the dummy structure DST.

Subsequently, shrunk third and fourth pad mask patterns 54A and 56A are removed. Thereafter, additional processes such as a process of replacing the first material layers 51A and 51B or the second material layers 52A and 52B with third material layers, and a process of forming contact plugs may be performed. The first material layers 51A and 51B or the second material layers 52A and 52B that are included in only the cell stack CST may be replaced with the third material layer. Alternatively, the first material layers 51A and 51B or the second material layers 52A and 52B that are included in both the cell stack CST and the dummy stack DST may be replaced with the third material layer.

According to the above-mentioned process, the dummy stack DST disposed in the peripheral circuit region PERI is formed using the reference pattern RP. Because the cell stack CST is formed simultaneously with the dummy stack DST, the cell stack CST may be easily aligned.

Figure 6:
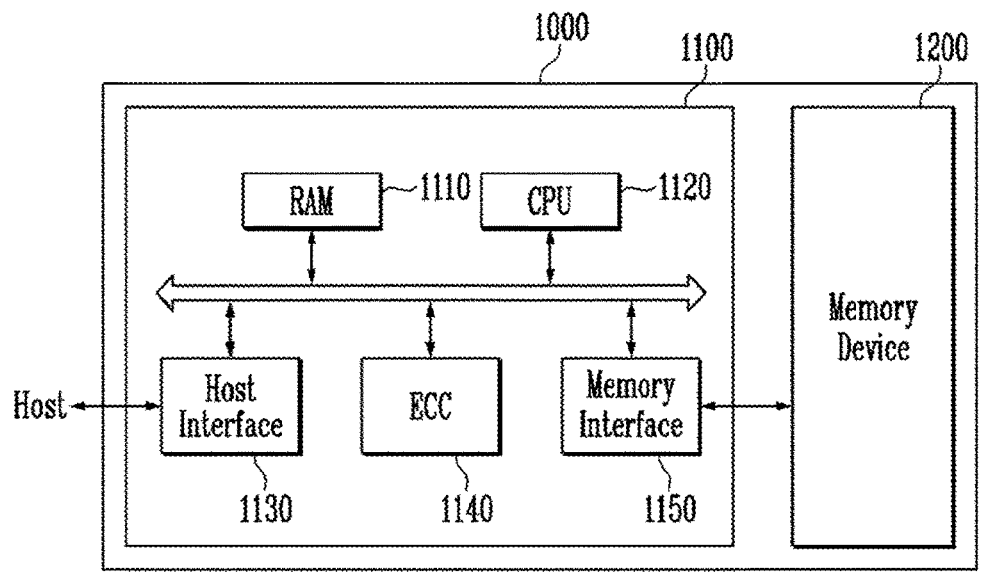
FIGS. 6 and 7 are block diagrams illustrating a configuration of a memory system according to an embodiment of the present disclosure.

FIG. 6 is a block diagram illustrating the configuration of a memory system according to an embodiment of the present disclosure.

Referring FIG. 6, a memory system 1000 according to an embodiment of the present disclosure includes a memory device 1200 and a controller 1100.

The memory device 1200 is used to store data information having a variety of data forms such as text, graphics, and software codes. The memory device 1200 may be a non-volatile memory. Furthermore, the memory device 1200 may have the structure described above with reference to FIGS. 1A to 5C, and may be manufactured by the manufacturing method described above with reference to FIGS. 1A to 5C. The structure of the memory device 1200 and the manufacturing method thereof are the same as those described above; therefore detailed explanation thereof will be omitted.

The controller 1100 may be coupled to a host Host and the memory device 1200. The controller 1100 may access the memory device 1200 in response to a request from the host Host. For example, the controller 1100 may control read, write, erase, and background operations of the memory device 1200.

The controller 1100 includes a random access memory (RAM) 1110, a central processing unit (CPU) 1120, a host interface 1130, an error correction code (ECC) circuit 1140, a memory interface 1150.

The RAM 1110 is used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like.

The CPU 1120 may control the overall operation of the controller 1100. For example, the CPU 1120 is configured to operate firmware such as a flash translation layer (FTL) stored in the RAM 1110.

The host interface 1130 is configured to interface with the host Host. For example, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 is configured to interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device or data to be transferred from the memory interface 1150 to the memory device 1200. In addition, the controller 1100 may further include a ROM that stores code data for interfacing with the host Host.

Because the memory system 1000 according to the embodiment includes the memory device 1200 having improved integration and characteristics, the integration and characteristics of the memory system 1000 may also be improved.

Figure 7:
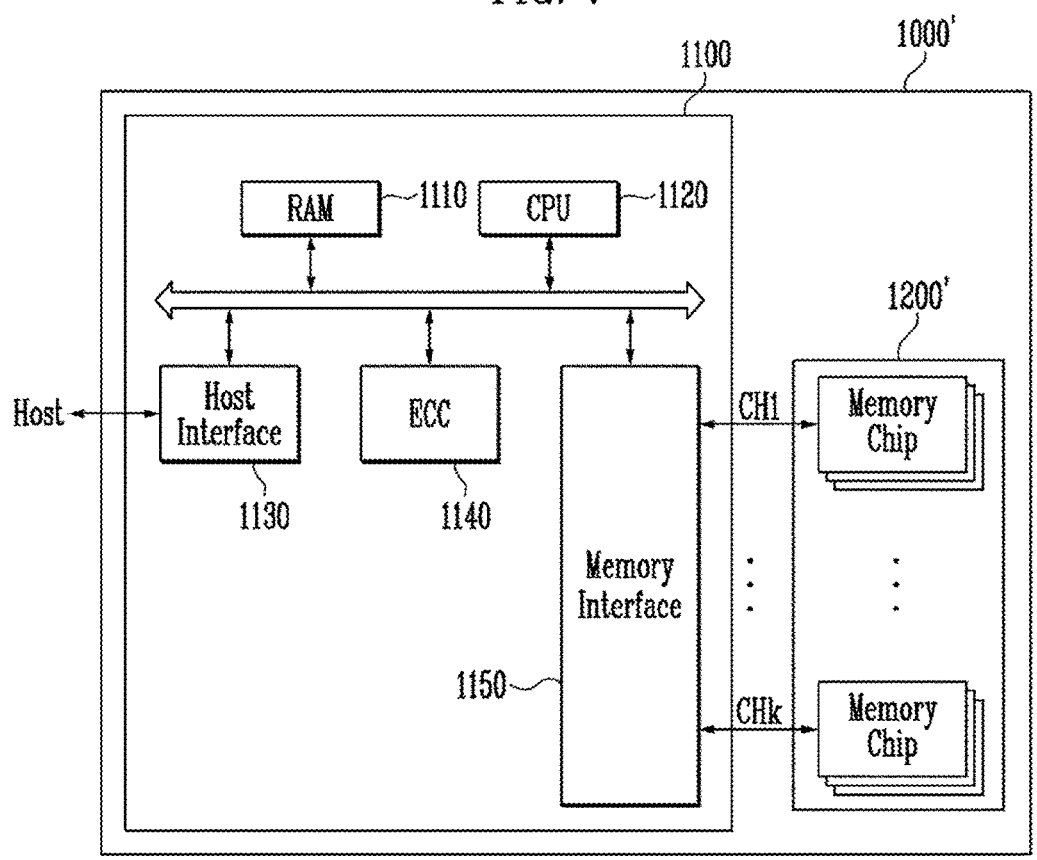

FIG. 7 is a block diagram illustrating a configuration of a memory system according to an embodiment of the present disclosure. Hereinbelow, repetitive explanation will be omitted if deemed redundant.

Referring to FIG. 7, a memory system 1000' according to an embodiment may include a memory device 1200' and a controller 1100. The controller 1100 includes a RAM 1110, a CPU 120, a host interface 1130, an ECC circuit 1140, a memory interface 1150, and so on.

The memory device 1200' may be a nonvolatile memory. Furthermore, the memory device 1200' may have the structure described above with reference to FIGS. 1A to 5C, and may be manufactured using the manufacturing method described above with reference to FIGS. 1A to 5C. The structure of the memory device 1200' and the manufacturing method thereof are the same as those described above; therefore detailed explanation thereof will be omitted.

Furthermore, the memory device 1200' may be a multi-chip package including a plurality of memory chips. The plurality of memory chips are divided into a plurality of groups. The plurality of groups are configured to communicate with the controller 1100 through first to k-th channels CH1 to CHk. The memory chips of each group communicate with the controller 1100 through a common channel. For reference, the memory system 1000' may be modified such that each single memory chip is coupled to a corresponding single channel.

As described above, because the memory system 1000' according to the embodiment includes the memory device 1200' having improved integration and characteristics, the integration and characteristics of the memory system 1000' may also be improved. In particular, the memory device 1200' according to the present embodiment is formed of a multi-chip package, whereby the data storage capacity and the operating speed thereof can be enhanced.

Figure 8:
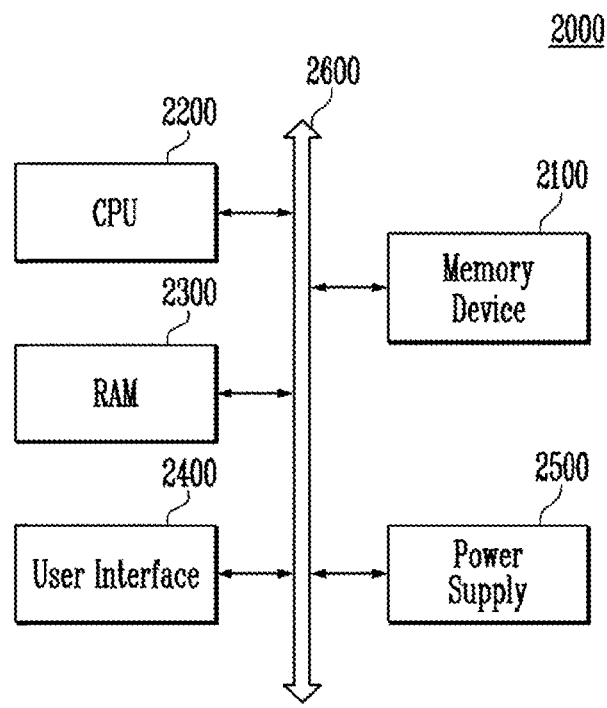
FIGS. 8 and 9 are block diagrams illustrating a configuration of a computing system according to an embodiment of the present disclosure.

FIG. 8 is a block diagram illustrating a configuration of a computing system according to an embodiment of the present disclosure. Hereinbelow, repetitive explanation will be omitted if deemed redundant.

Referring to FIG. 8, the computing system 2000 according to an embodiment of the present disclosure includes a memory device 2100, a CPU 2200, a RAM 2300, a user interface 2400, a power supply 2500, a system bus 2600, and so forth.

The memory device 2100 stores data provided via the user interface 2400, data processed by the CPU 2200, etc. Furthermore, the memory device 2100 is electrically coupled to the CPU 2200, the RAM 2300, the user interface 2400, the power supply 2500, etc. by the system bus 2600. For example, the memory device 2100 may be coupled to the system bus 2600 via a controller (not shown) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a nonvolatile memory. Furthermore, the memory device 2100 may have the structure described above with reference to FIGS. 1A to 5C, and may be manufactured by the manufacturing method described above with reference to FIGS. 1A to 5C. The structure of the memory device 2100 and the manufacturing method thereof are the same as those described above; therefore detailed explanation thereof will be omitted.

As described above with reference to FIG. 7, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, or the like.

As described above, because the computing system 2000 according to the embodiment includes the memory device 2100 having improved integration and characteristics, the characteristics of the computing system 2000 may also be improved.

Figure 9:
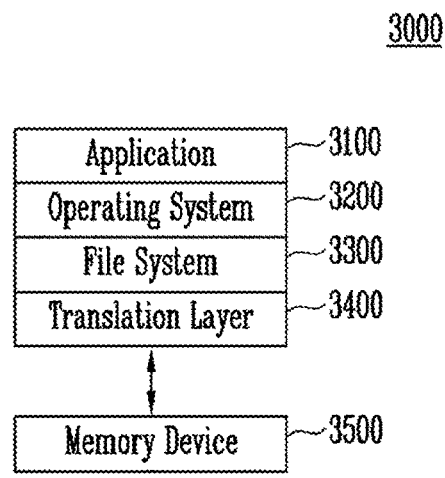

FIG. 9 is a block diagram illustrating a computing system according to an embodiment of the present disclosure.

Referring to FIG. 9, the computing system 3000 according to an embodiment of the present disclosure may include a software layer which has an operating system 3200, an application 3100, a file system 3300, a translation layer 3400, and so forth. Furthermore, the computing system 3000 includes a hardware layer such as a memory device 3500.

The operating system 3200 manages software resources and hardware resources, etc. of the computing system 3000 and may control program execution by the CPU. The application 3100 may be various application programs executed in the computing system 3000 and may be a utility executed by the operating system 3200.

The file system 3300 refers to a logical structure for controlling data, files, etc. which are present in the computing system 3000 and organizes files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are expressed by separate blocks in the drawing, the application 3100 and the file system 3300 may be included in the operating system 3200.

The translation layer 3400 translates an address into a suitable form for the memory device 3500 in response to a request from the file system 3300. For example, the translation layer 3400 translates a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have the structure described above with reference to FIGS. 1A to 5C, and may be manufactured by the manufacturing method described above with reference to FIGS. 1A to 5C. The structure of the memory device 3500 and the manufacturing method thereof are the same as those described above; therefore detailed explanation thereof will be omitted.

The computing system 3000 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, because the computing system 3000 according to the embodiment includes the memory device 3500 having improved integration and characteristics, the characteristics of the computing system 3000 may also be improved.

The present disclosure may provide a semiconductor device having a stable structure and improved reliability. In manufacturing the semiconductor device, the manufacturing process may be facilitated, and a procedure thereof may be simplified, and the manufacturing cost may be reduced.

Example embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, comprising:
    forming a first stack in which a first pad region, a second pad region, and a first dummy region are defined;
    forming a second stack on the first stack;
    forming a first stepped pad structure and a first reference pattern by patterning the second stack, the first stepped pad structure being disposed on the first pad region of the first stack, the first reference pattern being disposed on the first dummy region of the first stack;
    forming a first pad mask pattern on the first stack, the first pad mask pattern covering the first stepped pad structure and spaced apart from the first reference pattern, wherein a distance from the first reference pattern to the first pad mask pattern is measured to locate the first pad mask pattern at a desired position; and
    forming a second stepped pad structure by patterning the second pad region of the first stack while shrinking the first pad mask pattern.

2. The method according to claim 1, wherein a distance between a center of the first reference pattern and an edge of the first pad mask pattern is measured to locate the first pad mask pattern at the desired position.

3. The method according to claim 1, wherein a distance between an edge of the first reference pattern and an edge of the first pad mask pattern is measured to locate the first pad mask pattern at the desired position.

4. The method according to claim 1, wherein the first reference pattern has a height lower than a height of the first stepped pad structure.

5. The method according to claim 1,
    wherein the first stack comprises a second dummy region spaced apart from the first dummy region by a predetermined distance, and a third pad region disposed between the first dummy region and the second dummy region, and
    wherein a second reference pattern disposed on the second dummy region of the first stack is formed when the first reference pattern is formed.

6. The method according to claim 5, wherein the first reference pattern and the second reference pattern are transferred to the first stack when the second stepped pad structure is formed.

7. The method according to claim 6, further comprising:
    forming a second pad mask pattern after the forming of the second stepped pad structure, the second pad mask pattern covering the first pad region, the second pad region, the first dummy region, and the third pad region, wherein a distance from the second reference pattern to the second pad mask pattern is measured to locate the second pad pattern at the desired position; and
    forming a third stepped pad structure having a stepped shape by patterning the third pad region of the first stack while shrinking the second pad mask pattern.

8. The method according to claim 1,
    wherein the first stack comprises a second dummy region spaced apart from the first dummy region by a predetermined distance and a third pad region disposed between the first dummy region and the second dummy region, and
    wherein a second reference pattern is formed by patterning the second dummy region of the first stack when the second stepped pad structure is formed.

9. The method according to claim 8, further comprising:
    forming a second pad mask pattern after the forming of the second stepped pad structure, the second pad mask pattern being aligned by measuring a distance from the second reference pattern to the second pad mask pattern and covering the first pad region, the second pad region, the first dummy region and the third pad region; and
    forming a third stepped pad structure having a stepped shape by patterning the third pad region of the first stack while shrinking the second pad mask pattern.

10. The method according to claim 1,
    wherein a second reference pattern disposed on the first dummy region of the first stack and spaced apart from the first reference pattern by a predetermined distance is formed when the first reference pattern is formed, and
    wherein the first pad mask pattern is aligned by measuring a distance between the first pad mask pattern and a reference point disposed between the first reference pattern and the second reference pattern.

11. The method according to claim 10, wherein the reference point is disposed at a center at which a distance between a center of the first reference pattern and a center of the second reference pattern is divided into two equal parts.

12. The method according to claim 10, wherein when a distance between a first edge of the first reference pattern and a second edge of the second reference pattern which face each other is X, and a distance between the first edge and an edge of the first pad mask pattern is Y, a distance between the reference point and the edge of the first pad mask pattern is X/2+Y.

13. The method according to claim 1, wherein the first stack is formed on a cell region and a peripheral circuit region of a substrate, and includes the first pad region and the second pad region which are disposed in the peripheral circuit region, a third pad region and a fourth pad region which are disposed in the cell region, and the first dummy region disposed between the cell region and the peripheral circuit region.

14. The method according to claim 13, wherein a second pad mask pattern covering the third and fourth pad regions of the first stack is formed when the first pad mask pattern is formed, and the second pad mask pattern has a mirror-symmetrical structure with the first pad mask pattern.

15. The method according to claim 13, wherein a third stepped pad structure is formed when the first stepped pad structure is formed, the third stepped pad structure being disposed on the third pad region of the first stack and having a mirror-symmetrical structure with the first stepped pad structure, and a fourth stepped pad structure is formed when the second stepped pad structure is formed, the fourth stepped pad structure being disposed on the fourth pad region of the first stack and having the mirror-symmetrical structure with the second stepped pad structure.

16. The method according to claim 13, further comprising, before the forming of the first stack,
    forming a circuit in the peripheral circuit region of the substrate.

17. A method of manufacturing a semiconductor device, comprising:
    forming a first stack in which a first pad region, a second pad region, and a first dummy region are defined;
    forming a second stack on the first stack;
    forming a first mask pattern on the second stack;
    forming a first pad structure and a first reference pattern by patterning the second stack using the first mask pattern, the first pad structure being disposed on the first pad region of the first stack, the first reference pattern being disposed on the first dummy region of the first stack;
    removing the first mask pattern;
    forming a second mask pattern on the first stack, the second mask pattern covering the first pad structure and spaced apart from the first reference pattern, wherein a distance from the first reference pattern to the second mask pattern is measured to locate the second mask pattern at a desired position; and
    forming a second pad structure by patterning the second pad region of the first stack using the second mask pattern.

18. The method according to claim 17, wherein a distance between a center of the first reference pattern and an edge of the first mask pattern or between an edge of the first reference pattern and an edge of the first mask pattern is measured to locate the first mask pattern at the desired position.

19. A method of manufacturing a semiconductor device, comprising:
    forming a stack in which a first pad region, a second pad region, a first dummy region, a third pad region and a second dummy region are defined;
    forming a first pad structure, a first reference pattern and a second reference pattern on the stack, the first pad structure being disposed at the first pad region, the first reference pattern being disposed at the first dummy region and the second reference pattern being disposed at the second dummy region;
    forming a first pad mask pattern on the stack, the first pad mask pattern covering the first pad structure and spaced apart from the first reference pattern, wherein a distance from the first reference pattern to the first pad mask pattern is measured to locate the first pad mask pattern at a desired position;
    forming a second pad structure by patterning the stack using the first pad mask pattern, the second pad structure disposed at the second pad region;
    forming a second pad mask pattern, the second pad mask pattern covering the first pad structure, the second pad structure and the first reference pattern and spaced apart from the second reference pattern, wherein a distance from the second reference pattern to the second pad mask pattern is measured to locate the second pad mask pattern at a desired position; and
    forming a third pad structure by patterning the stack using the second pad mask pattern, the third pad structure disposed at the third pad region.

20. The method according to claim 19, wherein, when the second pad structure is formed by patterning the stack, the first reference pattern and the second reference pattern are transferred to the stack and the third pad structure is located between a transferred first reference pattern and a transferred second reference pattern.

* * * * *